US010228584B2

(12) United States Patent
Kim et al.

(10) Patent No.: US 10,228,584 B2
(45) Date of Patent: Mar. 12, 2019

(54) LIGHT SOURCE, AND BACK LIGHT UNIT AND LIQUID CRYSTAL DISPLAY INCLUDING THE LIGHT SOURCE

(71) Applicant: SAMSUNG ELECTRONICS CO., LTD., Suwon-si (KR)

(72) Inventors: Tae Hyung Kim, Seoul (KR); Eun Joo Jang, Suwon-si (KR); Shin Ae Jun, Seongnam-si (KR); Hyun A Kang, Suwon-si (KR); Yongwook Kim, Hwaseong-si (KR); Na Youn Won, Suwon-si (KR); Hyo Sook Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 138 days.

(21) Appl. No.: 14/860,378

(22) Filed: Sep. 21, 2015

(65) Prior Publication Data

US 2016/0186960 A1    Jun. 30, 2016

(30) Foreign Application Priority Data

Dec. 29, 2014    (KR) .................. 10-2014-0192265

(51) Int. Cl.
*F21V 8/00* (2006.01)
*F21V 9/30* (2018.01)
(Continued)

(52) U.S. Cl.
CPC .......... *G02F 1/133514* (2013.01); *F21V 9/30* (2018.02); *G02B 6/0073* (2013.01);
(Continued)

(58) Field of Classification Search
CPC ............ G02F 1/133514; G02B 6/0051; G02B 6/0073; F21V 9/16; F21V 9/30
(Continued)

(56) References Cited

U.S. PATENT DOCUMENTS 8,487,331 B2    7/2013    Jang et al.
8,702,277 B2    4/2014    Im et al.
(Continued)

FOREIGN PATENT DOCUMENTS

CN    103952137    7/2014
EP    2489643    8/2012
(Continued)

OTHER PUBLICATIONS

Korean Office Action-KR Application No. 10-2014-0192265 dated Apr. 29, 2015, citing KR10-2011-0109714, KR10-2007-0037288, JP2012-069572 and KR10-2014-0056490.
(Continued)

*Primary Examiner* — Lucy P Chien
(74) *Attorney, Agent, or Firm* — Cantor Colburn LLP

(57) ABSTRACT

A light source includes a light emitting element which emits light, and a light conversion layer which converts the light emitted from the light emitting element into white light and emits the white light, where the light conversion layer includes a resin and a quantum dot material mixed with the resin, and a red apex of a color region of the white light is positioned in a region of $0.65<Cx<0.69$ and $0.29<Cy<0.3370$ in color coordinates, and a green apex of a color region of the white light is positioned in a region of $0.17<Cx<0.31$ and $0.61<Cy<0.70$ in the color coordinates.

30 Claims, 15 Drawing Sheets

(51) Int. Cl.
*G02F 1/1335* (2006.01)
*G02F 1/13357* (2006.01)
(52) U.S. Cl.
CPC ...... *G02F 1/1336* (2013.01); *G02F 1/133603* (2013.01); *G02B 6/0026* (2013.01); *G02B 6/0046* (2013.01); *G02B 6/0051* (2013.01); *G02F 2001/133614* (2013.01); *H01L 2224/48091* (2013.01)
(58) Field of Classification Search
USPC .......................................................... 349/71
See application file for complete search history.

(56) References Cited

U.S. PATENT DOCUMENTS

| | | |
|---|---|---|
| 8,919,997 B2 | 12/2014 | Im et al. |
| 8,919,998 B2 | 12/2014 | Im et al. |
| 2007/0164661 A1 | 7/2007 | Kuma |
| 2008/0084517 A1* | 4/2008 | Itou ................... G02F 1/133555 349/62 |
| 2012/0113672 A1 | 5/2012 | Dubrow et al. |
| 2013/0039032 A1 | 2/2013 | Kim et al. |
| 2013/0070443 A1* | 3/2013 | Pan ........................... C09K 9/02 362/84 |
| 2013/0335677 A1* | 12/2013 | You ................... G02F 1/133609 349/65 |
| 2014/0119049 A1 | 5/2014 | Kim et al. |
| 2014/0158982 A1 | 6/2014 | Park et al. |
| 2015/0098212 A1* | 4/2015 | Won ................... G02F 1/133615 362/97.3 |
| 2015/0221831 A1* | 8/2015 | Kim ........................ H01L 33/56 257/98 |
| 2016/0042703 A1* | 2/2016 | Fan ....................... G09G 3/3607 345/88 |

FOREIGN PATENT DOCUMENTS

| | | |
|---|---|---|
| JP | 2012069572 | 4/2012 |
| KR | 1020070037288 | 4/2007 |
| KR | 1020110078319 | 7/2011 |
| KR | 1020110109714 | 10/2011 |
| KR | 1020120006459 | 1/2012 |
| KR | 1020130015847 | 2/2013 |
| KR | 1020130079804 | 7/2013 |
| KR | 1020140056490 | 5/2014 |
| KR | 101489280 | 1/2015 |

OTHER PUBLICATIONS

Extended European Search Report-European Application No. 15198503.3 dated Mar. 21, 2016, citing EP2489643 and CN103952137.

\* cited by examiner

[FIG. 1]
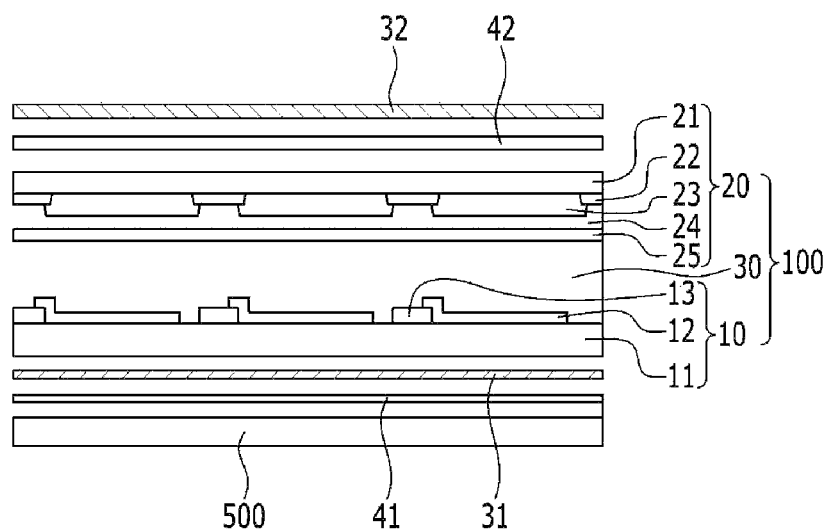
[FIG. 2]
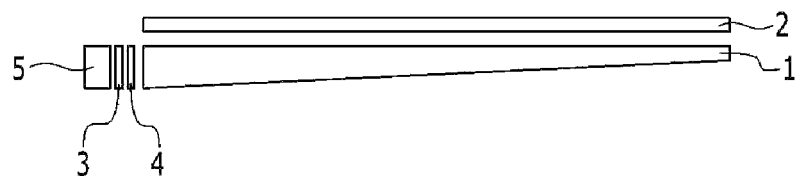
[FIG. 3]
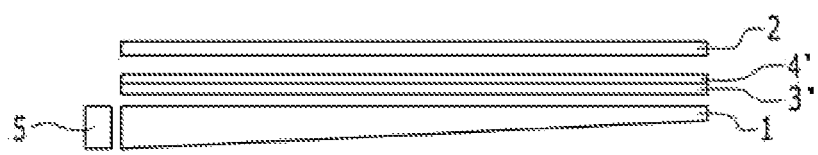

[FIG. 4]
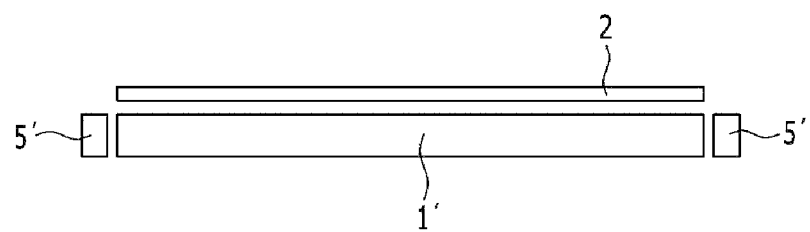
[FIG. 5]
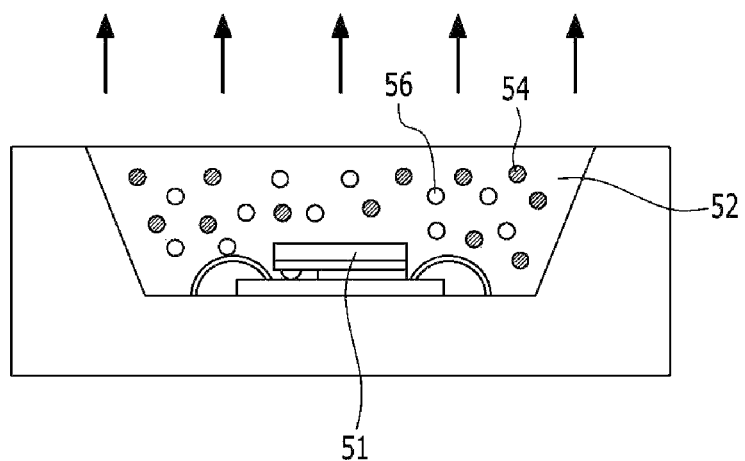
[FIG. 6]
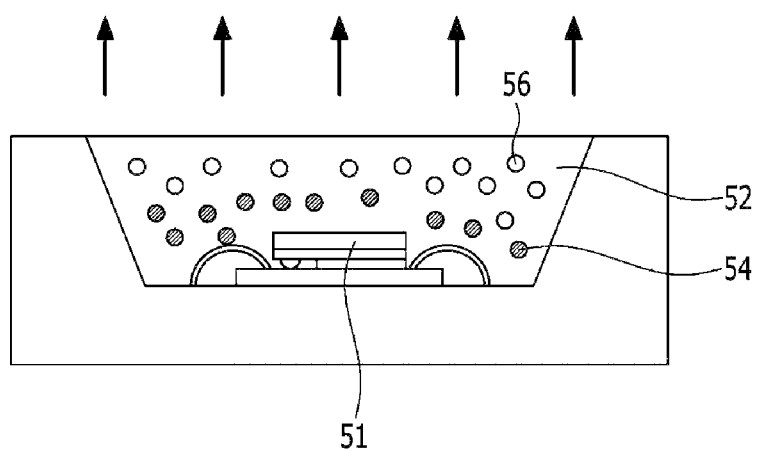

[FIG. 7]
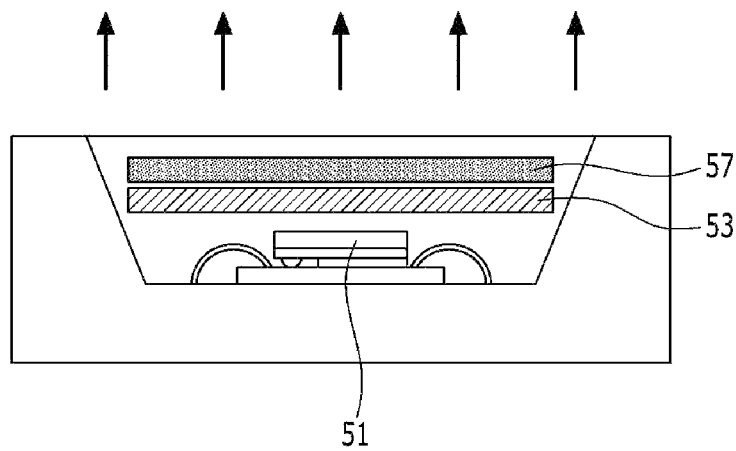
[FIG. 8]
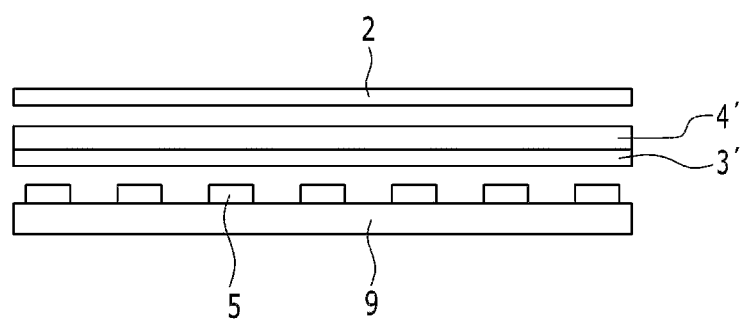
[FIG. 9]
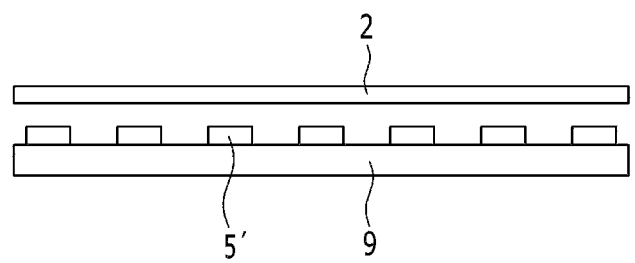

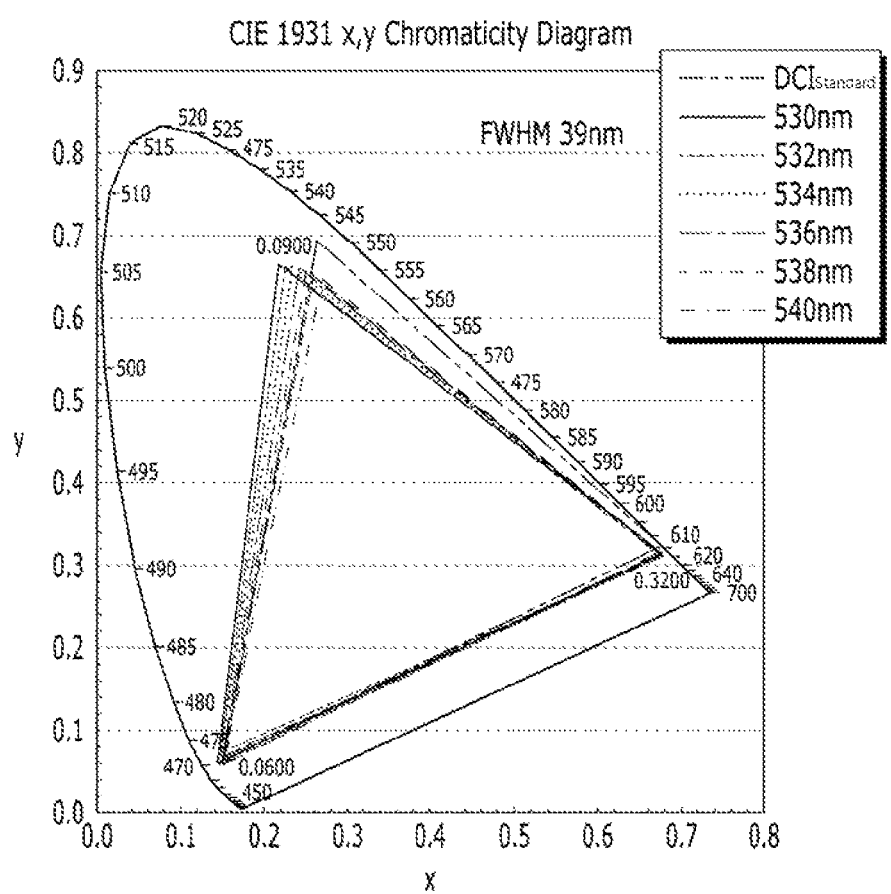
[FIG. 10]

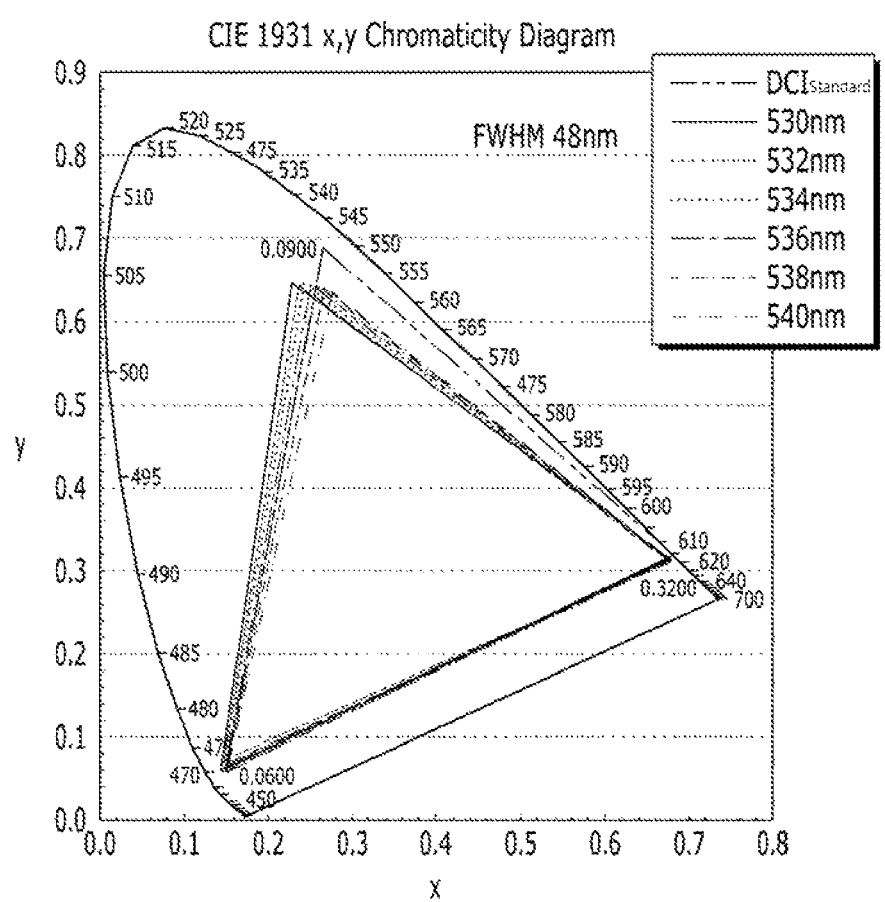
[FIG. 11]

[FIG. 12]
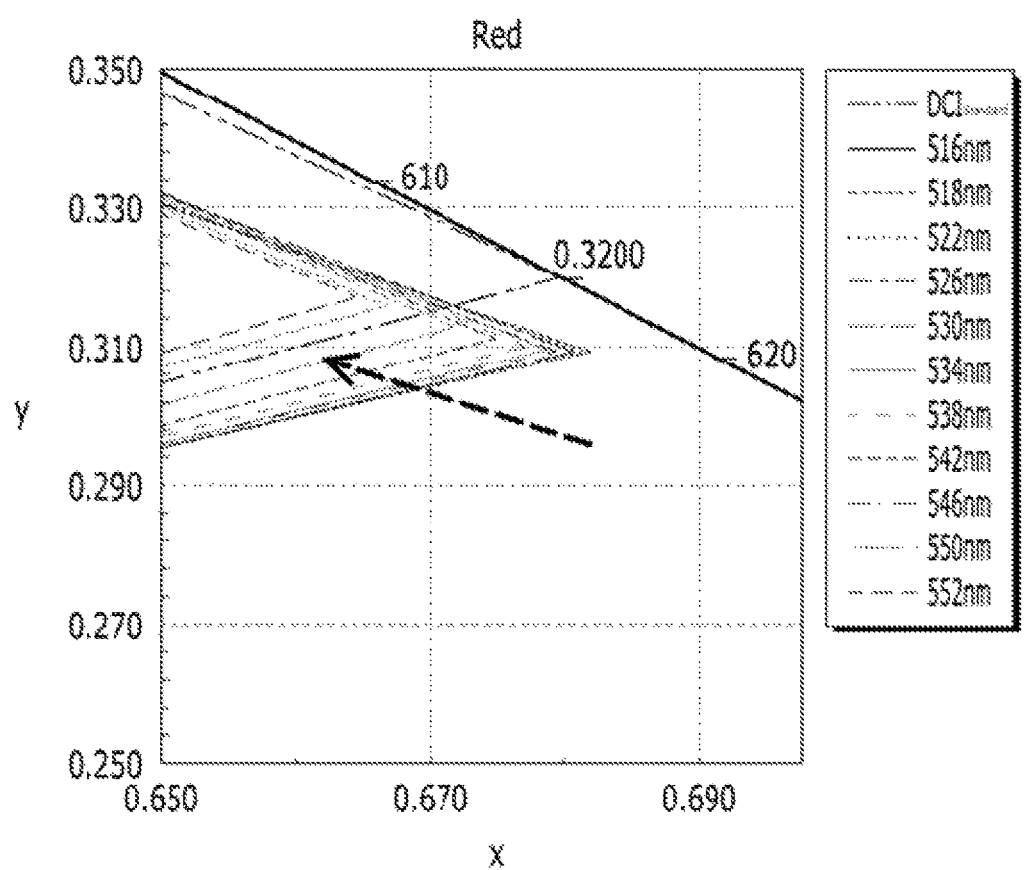

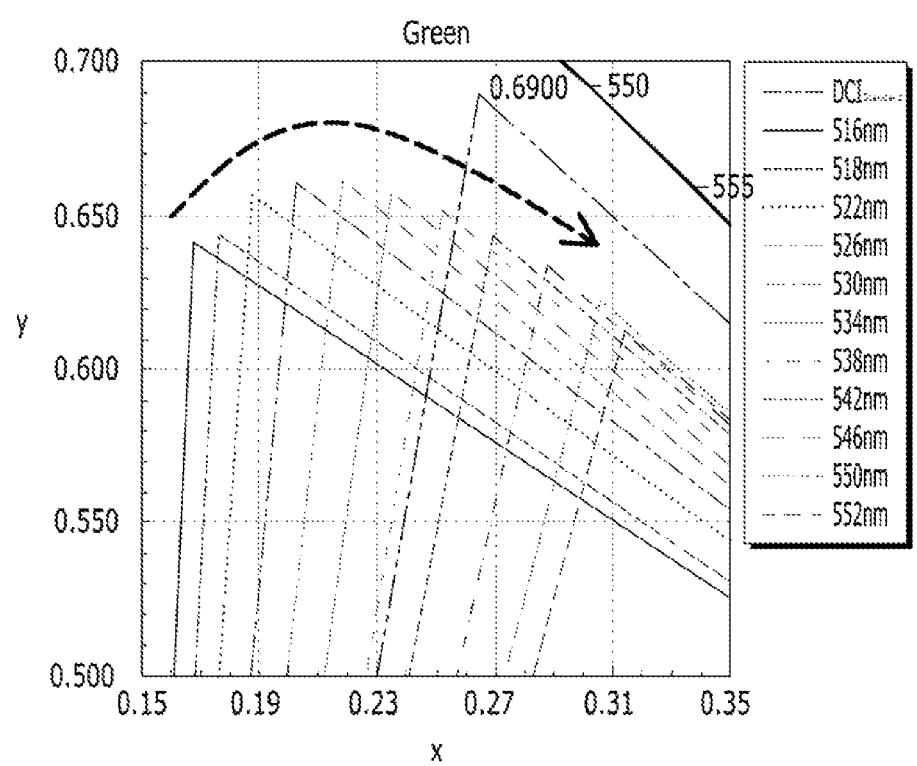
[FIG. 13]

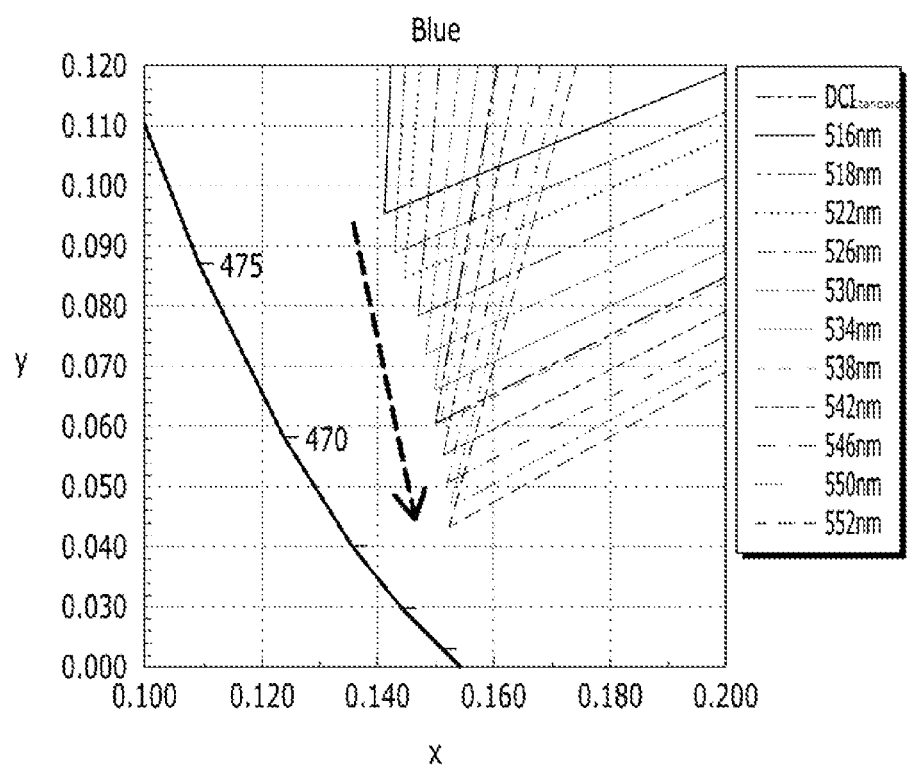

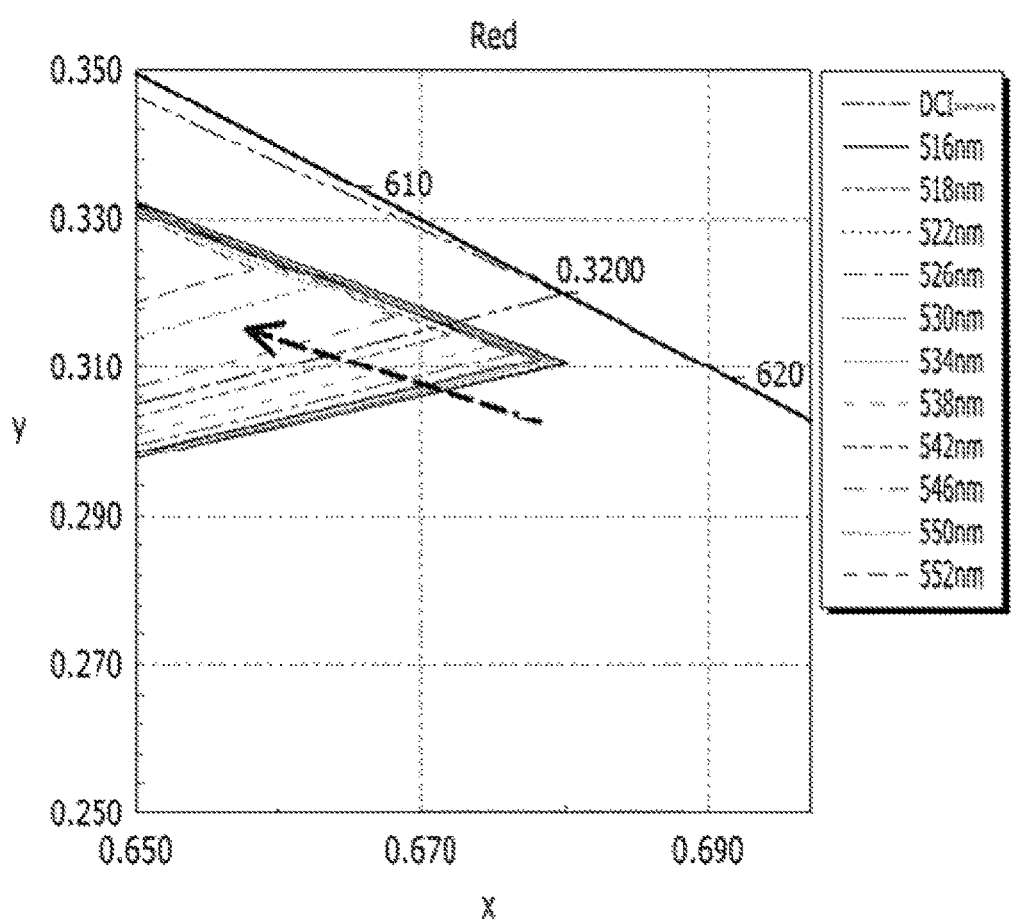
[FIG. 15]

[FIG. 16]
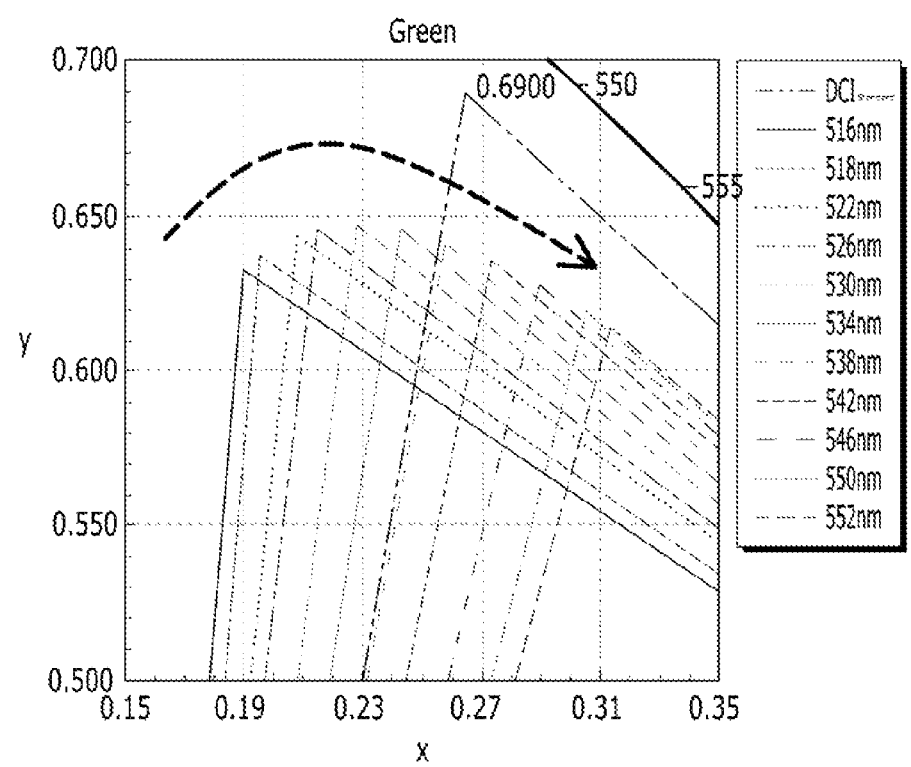

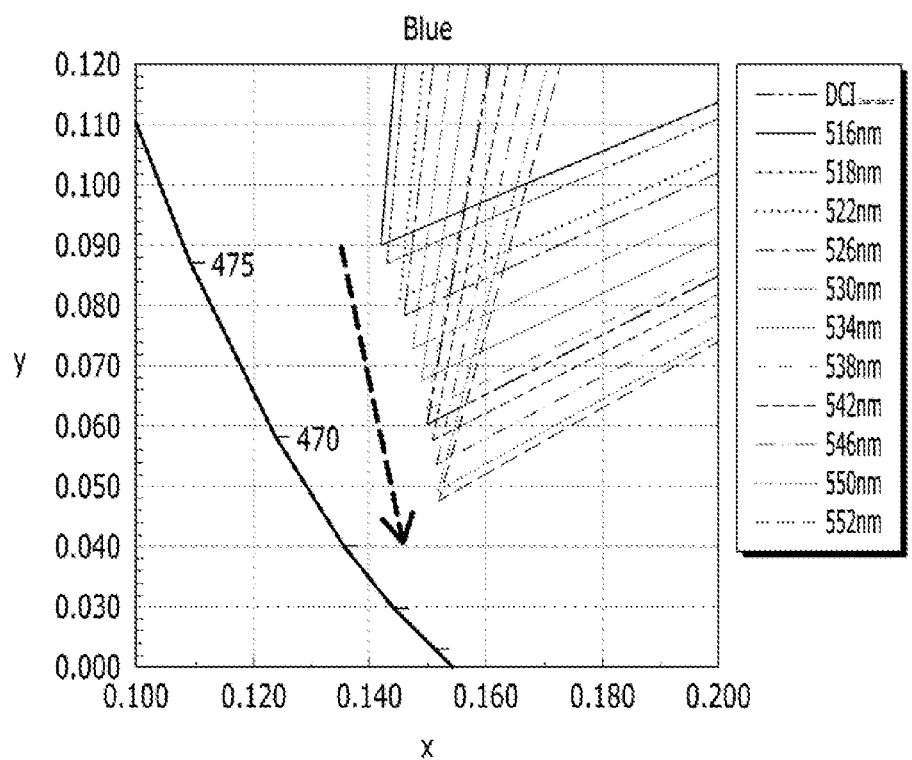
[FIG. 17]

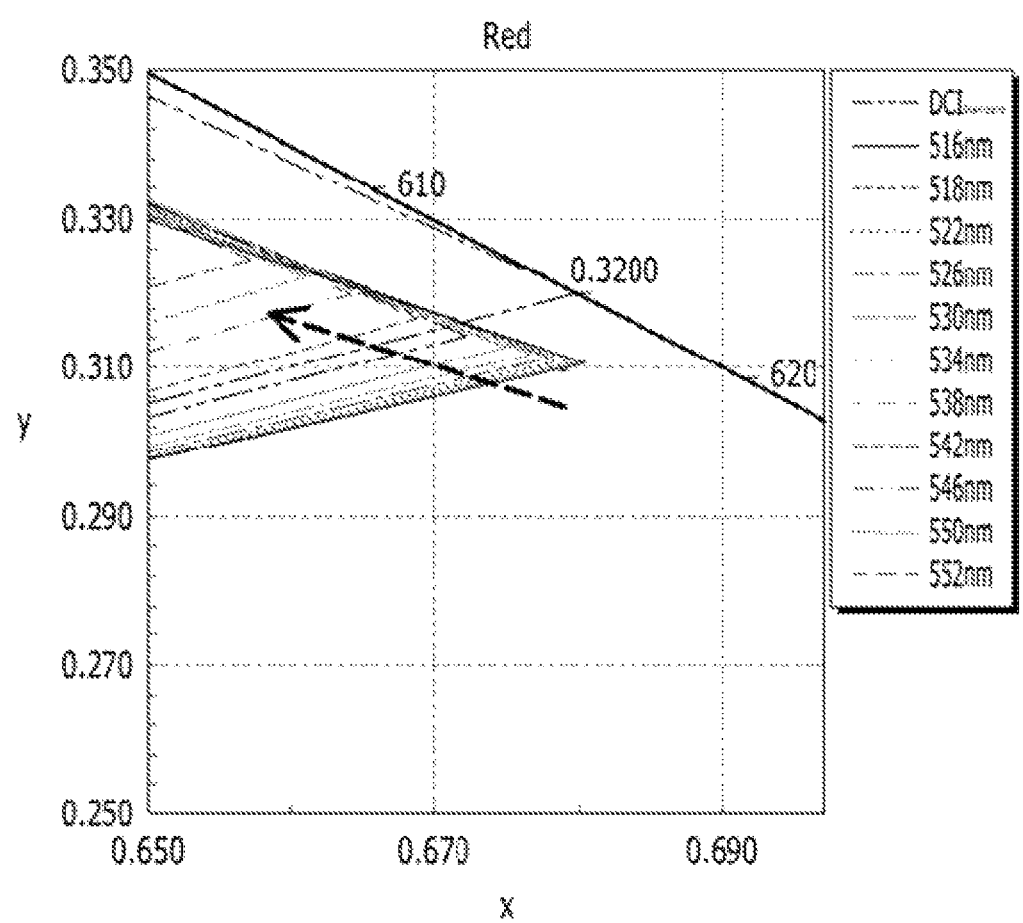

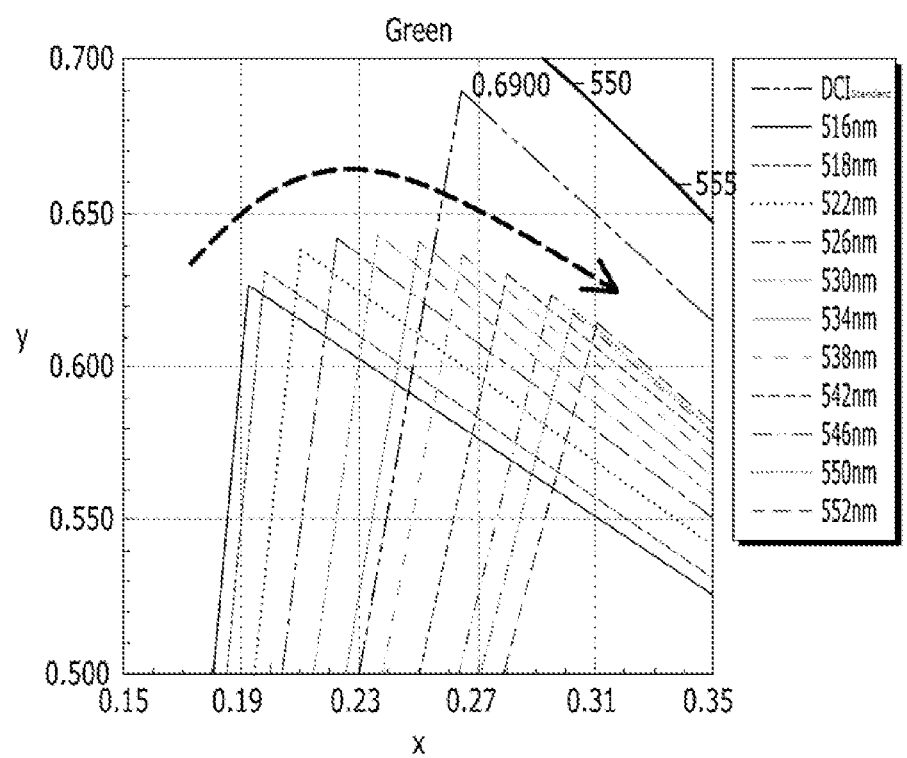
[FIG. 19]

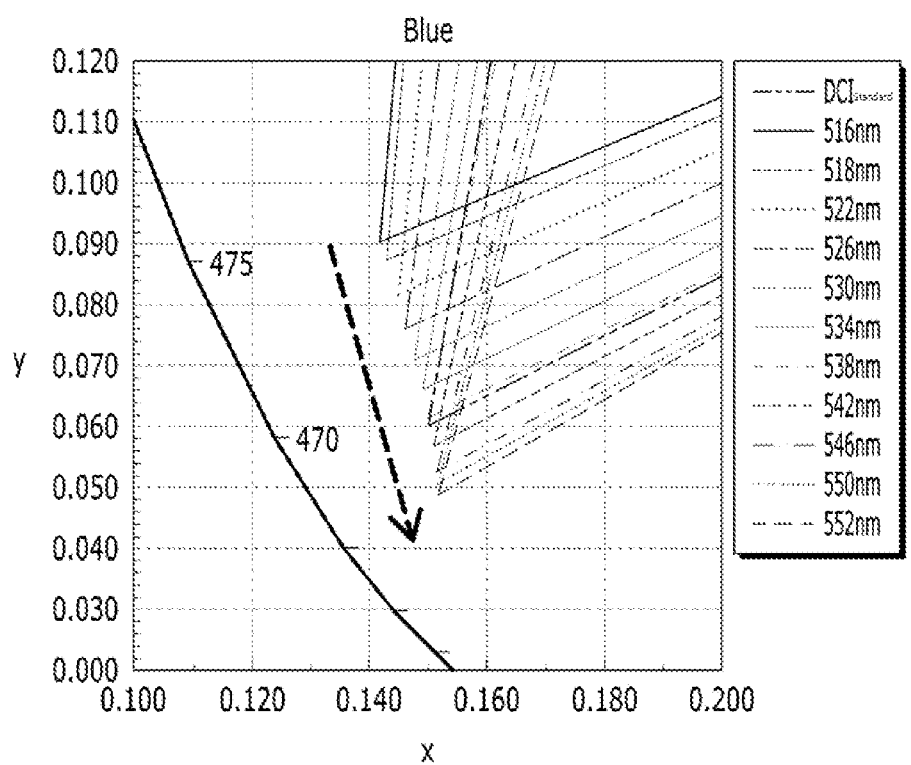
[FIG. 20]

[FIG. 21]
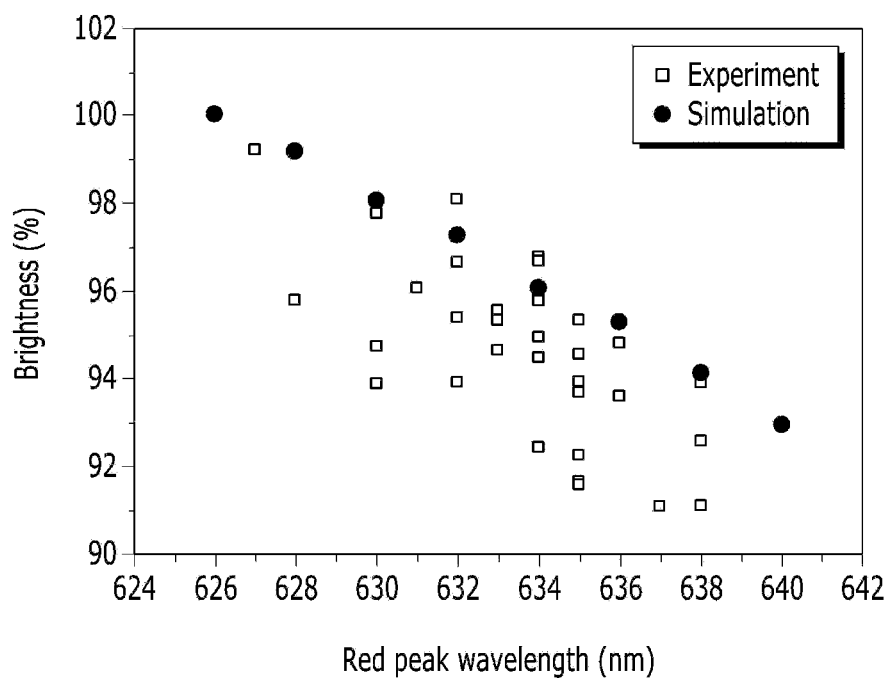
[FIG. 22]
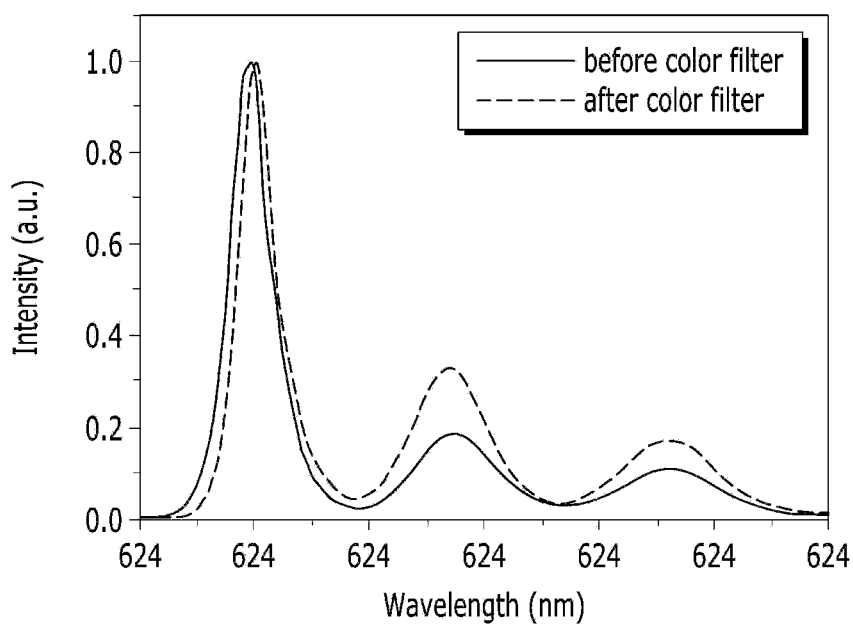

US 10,228,584 B2

LIGHT SOURCE, AND BACK LIGHT UNIT AND LIQUID CRYSTAL DISPLAY INCLUDING THE LIGHT SOURCE

CROSS-REFERENCE TO RELATED APPLICATIONS

This application claims priority to Korean Patent Application No. 10-2014-0192265 filed on Dec. 29, 2014, and all the benefits accruing therefrom under 35 U.S.C. § 119, the content of which in its entirety is herein incorporated by reference.

BACKGROUND

1. Field

This disclosure relates to a light source, and a backlight unit and a liquid crystal display ("LCD") including the light source.

2. Description of the Related Art

A liquid crystal display ("LCD") typically includes a backlight unit as a light source. The backlight unit includes a light emitting element. As for the light emitting element of the backlight unit, a cold cathode fluorescent light ("CCFL") has been conventionally used, but a light emitting diode has been recently widely used.

The light emitting diode using a semiconductor has a long life span, is able to be down-sized, and consumes a small amount of power and includes no mercury, and thus has environmentally-friendly characteristics, and accordingly, has drawn attention as one of the next generation light emitting elements that may replace the conventional light emitting element.

SUMMARY

A light emitting diode is used as a light emitting element for a backlight, and expands a color region that a liquid crystal display ("LCD") may express, but still expresses some extent of the color region with reference to sRGB or Adobe RGB. Accordingly, a liquid crystal display ("LCD") capable of expressing a sufficient color region with reference to a digital cinema initiative ("DCI") standard or a light source for such an LCD is desired.

Accordingly, one embodiment of the present invention provides an LCD capable of expressing a color region up to greater than or equal to a particular area of the DCI standard and a light source thereof.

According to one embodiment, a light source includes a light emitting element which emits light, and a light conversion layer which converts the light emitted from the light emitting element into white light and emits the white light, where the light conversion layer includes a resin and a quantum dot material mixed with the resin, and the white light includes a green light component having a peak wavelength of about 518 nanometers (nm) to about 550 nm and a full width at half maximum ("FWHM") of less than about 90 nm, and a red light component having a peak wavelength in a region of greater than or equal to about 620 nm.

In an embodiment, a light source includes a light emitting element which emits light, and a light conversion layer which converts the light emitted from the light emitting element into white light and emits the white light, where the light conversion layer includes a resin and a quantum dot material mixed with the resin, and a red apex of a color region of the white light is positioned in a region of $0.65<Cx<0.69$ and $0.29<Cy<0.33$ in color coordinates, and a green apex of the color region of the white light is positioned in a region of $0.17<Cx<0.31$ and $0.61<Cy<0.70$ in the color coordinates.

In an embodiment, the backlight unit includes a light emitting element which emits light, a light conversion layer which converts the light emitted from the light emitting element into white light and emits the white light, where the light conversion layer includes a resin and a quantum dot material mixed with the resin, and a red apex of a color region of the white light is positioned in a region of $0.65<Cx<0.69$ and $0.29<Cy<0.33$ in color coordinates, and a green apex of the color region of the white light is positioned in a region of $0.17<Cx<0.31$ and $0.61<Cy<0.70$ in the color coordinates.

In an embodiment, an LCD includes: a liquid crystal panel including a plurality of color filters; and a backlight unit including a light emitting element which emits light, and a light conversion layer which converts the light emitted from the light emitting element into white light, and supplies the white light to the liquid crystal panel, where a red apex of a color region of the white light is positioned in a region of $0.65<Cx<0.69$ and $0.29<Cy<0.33$ in color coordinates after the white light passes through the color filters, and a green apex of the color region of the white light is positioned in a region of $0.17<Cx<0.31$ and $0.61<Cy<0.70$ in the color coordinates after the white light passes through the color filters.

BRIEF DESCRIPTION OF THE DRAWINGS

These and/or other features of the invention will become apparent and more readily appreciated from the following detailed description of embodiments thereof, taken in conjunction with the accompanying drawings, in which:

FIG. 1 is a cross-sectional view showing an embodiment of a liquid crystal display ("LCD");

FIGS. 2 to 4 are cross-sectional views showing embodiments of an edge-type backlight unit;

FIGS. 5 to 7 are cross-sectional views showing embodiments of a light emitting element;

FIGS. 8 and 9 are cross-sectional views showing embodiments of a direct-type backlight unit;

FIG. 10 is a graph showing how a color region supported by a light source that emits white light including a green light component having a full width at half maximum ("FWHM") of 39 nanometers (nm) is shifted in color coordinates as the peak position of a green light component is shifted;

FIG. 11 is a graph showing color regions supported by white light sources in color coordinates, which is shifted by changing the peak position of a green light component having a FWHM of 48 nm in several experimental examples;

FIG. 12 is a graph showing how the red apex of a color region supported by a light source emitting white light including a green light component having a FWHM of 39 nm is shifted in color coordinates as the peak position of the green light component is shifted;

FIG. 13 is a graph showing how the green apex of a color region supported by a light source emitting white light including a green light component having a FWHM of 39 nm is shifted in color coordinates as the peak position of the green light component is shifted;

FIG. 14 is a graph showing how the blue apex of a color region supported by a light source emitting white light including a green light component having a FWHM of 39 nm is shifted in color coordinates as the peak position of the green light component is shifted;

FIG. 15 is a graph showing how the red apex of a color region supported by a light source emitting white light including a green light component having a FWHM of 48 nm is shifted in color coordinates as the peak position of the green light component is shifted;

FIG. 16 is a graph showing how the green apex of a color region supported by a light source emitting white light including a green light component having a FWHM of 48 nm is shifted in color coordinates as the peak position of the green light component is shifted;

FIG. 17 is a graph showing how the blue apex of a color region supported by a light source emitting white light including a green light component having a FWHM of 48 nm is shifted in color coordinates as the peak position of the green light component is shifted;

FIG. 18 is a graph showing how the red apex of a color region supported by a light source emitting white light including a green light component having a FWHM of 54 nm is shifted in color coordinates as the peak position of the green light component is shifted;

FIG. 19 is a graph showing how the green apex of a color region supported by a light source emitting white light including a green light component having a FWHM of 54 nm is shifted in color coordinates as the peak position of the green light component is shifted;

FIG. 20 is a graph showing how the blue apex of a color region supported by a light source emitting white light including a green light component having a FWHM of 54 nm is shifted in color coordinates as the peak position of the green light component is shifted;

FIG. 21 is a graph showing luminance change of white light emitted by a backlight unit (or a light source) depending on the peak position of the red light component; and FIG. 22 is a graph comparing spectrum of white light emitted by an embodiment of a backlight unit according to the invention, with spectrum of the white light after passing a color filter.

DETAILED DESCRIPTION

The present disclosure will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example In an exemplary embodiment, if when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, embodiments of the invention will be described in detail with reference to the accompanying drawings.

FIG. 1 is a cross-sectional view of an embodiment of a liquid crystal display ("LCD") according to the invention.

An embodiment of the LCD according to the invention includes a liquid crystal panel 100, a pair of polarizing films, e.g., an upper polarizing film 31 and a lower polarizing film 32, respectively disposed on and under (e.g., on opposing surfaces of) the liquid crystal panel 100, a compensation film on a surface of the liquid crystal panel 100, e.g., a plurality of compensation films 41 and 42, respectively disposed on and under the liquid crystal panel 100, and a backlight unit 500. The compensation film 41 or 42 may be disposed on only one of an upper and lower surface of the liquid crystal panel 100, and the number thereof may be one or greater than one.

The liquid crystal panel 100 includes a lower panel 10 and an upper panel 20, and a liquid crystal layer 30 interposed between the display panels 10 and 20. The lower panel 10 may include a transparent substrate 11, a thin film transistor 13 disposed on the substrate 11, and a pixel electrode 12 connected to the thin film transistor 13. In one embodiment, for example, the thin film transistor 13 may be formed on the substrate by a thin film process, and switch voltage application to the pixel electrode 12. The upper panel 20 may include a transparent substrate 21, a black matrix 22, and a color filter 23 disposed on the transparent substrate 21, a planarization layer 24 which is disposed on or covers the black matrix 22 and the color filter 23, and a common electrode 25 which is disposed on or covers the planarization layer 24. The pixel electrode 12 is disposed or provided separately in a position corresponding to each color filter 23.

The backlight unit 500 includes a light emitting element that emits blue light or ultraviolet ("UV") rays, and a light conversion layer including a quantum dot material such that the light conversion layer converts the blue light or UV rays into white light. The backlight unit 500 may function as a light source that supplies light to the liquid crystal panel 100.

The light supplied by the backlight unit 500 becomes linear polarized light through, e.g., after passed through, the lower polarizing film 31, and the phase of the linear polarized light is selectively changed through the liquid crystal layer 30. The light passed through the liquid crystal layer 30 is filtered into red, green and blue lights through the color filter 23, and reaches the upper polarizing film 32, but the red, green and blue lights pass through the upper polarizing film 32 in different light amounts from each other depending on the phase-changed degrees thereof in the liquid crystal layer 30. The light amount passing through the upper polarizing film 32 may be controlled by adjusting a voltage applied to each pixel electrode 12, and thus an amount of each red, green and blue light passed through the upper polarizing film 32 may be independently controlled. The LCD may display a color image through such a process. Herein, the color region displayed by the LCD is determined depending on color purity of the red, green and blue components included in the white light source supplied by the backlight unit 500. Since the red, green and blue lights extracted by filtering the white light supplied by the backlight unit 500 through the color filter 23 are used to display an image, the LCD may display various colors and thus express a large color region in color coordinates when the red, green and blue lights included in the white light have high color purity. An embodiment of the LCD according to the invention may display a triangle color region (e.g., a triangle color region in CIE 1931 xy chromaticity diagram), where, in color coordinates, a red apex is positioned in the region of $0.65<Cx<0.69$ and $0.29<Cy<0.33$, a green apex is positioned in the region of $0.17<Cx<0.31$ and $0.61<Cy<0.70$, and a blue apex is positioned in the region of $0.12<Cx<0.18$ and $0.04<Cy<0.09$. Herein, the color coordinates may be coordinates of CIE 1931 xy chromaticity diagram. Herein, Cx and Cy may be values of x-axis and y-axis, respectively, in CIE 1931 xy chromaticity diagram. The white light supplied by the backlight unit 500 includes red, green and blue components having color purity capable of expressing the above-defined triangle color region. The above-defined triangle color region may be defined or drawn by passing the white light supplied by the backlight unit 500 through a red filter to extract a red component, passing the white light through a green filter to extract a green component, and passing the white light through a blue filter to extract a blue component, and then connecting each apex corresponding to each color component in the color coordinates. When the backlight unit 500 is combined with the liquid crystal panel 100 to manufacture an LCD, the color filter 23 in the liquid crystal panel 100 is used to measure each color spectrum. In an embodiment, a red spectrum may be obtained by turning on a red pixel but turning off the rest of pixels of the LCD, a green spectrum may be obtained by turning on a green pixel but turning off the rest of pixels of the LCD, and a blue spectrum may be obtained by turning on a blue pixel but turning off the rest of pixels of the LCD. In an alternative embodiment, the position of each color component in the color coordinates may be calculated by measuring spectrum of white light emitted by the backlight unit 500 with a spectroscope and using the peak and the full width at half maximum ("FWHM") of the spectrum.

Herein, a blue component is in general emitted by a blue light emitting diode and is determined by characteristics of the blue light emitting diode and may have no room for change. Accordingly, only characteristics of red and green components may be considered herein.

An embodiment of the LCD according to the invention may display a triangle color region in CIE 1931 xy chromaticity diagram, where, in color coordinates, a red apex is positioned in the region of $0.6611<Cx<0.6821$ and $0.3092<Cy<0.3220$, a green apex is positioned in the region of $0.1768<Cx<0.3061$ and $0.6190<Cy<0.6615$, and a blue apex is positioned in the region of $0.1429<Cx<0.1525$ and $0.0463<Cy<0.0885$. This triangle color region corresponds to a color region expressing about 80% of a digital cinema initiative ("DCI") standard. The white light supplied by the backlight unit 500 includes red, green and blue components having color purity capable of expressing the above-defined triangle color region. In such an embodiment, the white light emitted by the backlight unit 500 may include a green light component having a peak wavelength in a range from about 518 nanometers (nm) to about 550 nm and a FWHM of less than about 90 nm, and a red light component having a peak wavelength of greater than or equal to about 620 nm. In an embodiment, where the red light component has a FWHM of less than or equal to about 50 nm or a peak wavelength of less than or equal to about 640 nm, the backlight may have improved display luminance.

An embodiment of the LCD according to the invention may display a triangle color region in CIE 1931 xy chromaticity diagram, where in color coordinates, a red apex is positioned in the region of $0.6747<Cx<0.6789$ and $0.3097<Cy<0.3127$, a green apex is positioned in the region of $0.2352<Cx<0.2611$ and $0.6420<Cy<0.6578$, and a blue apex is positioned in the region of $0.1494<Cx<0.1512$ and $0.0575<Cy<0.0657$. Such a triangle color region is a color region expressing about 90% of the DCI standard. The white light emitted by the backlight unit 500 includes red, green and blue components having color purity capable of expressing the above defined triangle color region. In such an embodiment, the white light emitted by the backlight unit 500 may include a green light component having a peak wavelength in a range from about 534 nm to about 540 nm and a FWHM of less than about 50 nm, and a red light component having a peak wavelength of greater than or equal to about 620 nm. In an embodiment, where the red light component has a FWHM of less than or equal to about 50 nm or a peak wavelength of less than or equal to about 640 nm, display luminance may be improved.

Hereinafter, an embodiment of a backlight unit 500 of an LCD will be described in greater detail.

FIGS. 2 to 4 are cross-sectional views of embodiments of an edge-type backlight unit according to the invention.

Referring to FIG. 2, an embodiment of the backlight unit includes a wedge-type light guide 1, a light diffusion plate 2 disposed on the light guide 1, a light emitting element 5 disposed at a side of the light guide 1, and a light conversion layer, e.g., a plurality of conversion layers 3 and 4, interposed between the light guide 1 and the diffusion plate 2.

The light guide 1 is a transparent wedge-type quadrangle plate which becomes gradually thinner from a side to the opposite side, and transforms line light into surface light. The diffusion plate 2 scatters the surface light emitted from the light guide 1 and thereby uniformly spreads the surface light. The light emitting element 5 may be a plurality of blue light emitting diodes linearly arranged, e.g., arranged along a single line. The light conversion layers 3 and 4 includes a quantum dot material, and thus receives blue light emitted from the blue light emitting diode and converts a part thereof into green light and red light to emit white light. In an embodiment, the light conversion layers 3 and 4 may be separately defined from the blue light emitting diodes, that is, the light conversion layers 3 and 4 may be separately formed with the blue light emitting diodes not to constitute the light emitting element 5 as an element thereof. The light conversion layers may include two light conversion layers 3 and 4 separated or spaced apart from each other such that one of the two light conversion layers 3 and 4 may convert blue light into green light and the other of the two light conversion layers 3 and 4 may convert blue light into red light, or each of the two light conversion layers 3 and 4 may include a quantum dot to convert blue light into green light and a quantum dot to convert blue light into red light. In an alternative embodiment, two light conversion layers 3 and 4 are attached to each other or be integrally formed as a single unitary and indivisible unit, and may define a single light conversion layer including a quantum dot to convert blue light into green light and a quantum dot to convert blue light into red light. The light conversion layers 3 and 4 may include films formed by mixing a quantum dot material with a resin, and may include a scatterer such as silica and the like or an auxiliary component to improve optical properties. The quantum dot material may include a nanocrystal and the like including at least one selected from a Si-based nanocrystal, a Group II-IV-based compound semiconductor nanocrystal, a Group III-V-based compound semiconductor nanocrystal, a Group IV-IV-based compound semiconductor nanocrystal, and a mixture thereof. The Group II-IV-based compound semiconductor nanocrystal may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, the Group III-V-based compound semiconductor nanocrystal may include GaN, GaP, GaAs, AlN, AlP, AlAs, InN, InP, InZnP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs and InAlPAs, and the Group IV-IV-based compound semiconductor nanocrystal may include SbTe. The quantum dot material may be included in an amount of less than or equal to about 5 weight percent (wt %) based on the total weight of the light conversion layers 3 and 4. The resin may include silicone, epoxy, acrylate or the like. The scatterer may include ZnO, $Al_2O_3$, ZrO or the like, and may be included in an amount of about 10 wt % based on the total weight of the light conversion layers 3 and 4.

Referring to FIG. 3, an alternative embodiment of the backlight unit includes a wedge-type light guide 1, a light diffusion plate 2 disposed on the light guide 1, a light emitting element 5 disposed at a side of the light guide 1, and a light conversion layer, e.g., a plurality of light conversion layers 3' and 4', interposed between the light guide 1 and the diffusion plate 2. In such an embodiment, the light conversion layers 3' and 4' to convert blue light into white light is disposed between the light guide 1 and the diffusion plate 2, as shown in FIG. 3. The light conversion layers 3' and 4' may be disposed on the diffusion plate 2. The structure, components and quantum dot material of the light conversion layers 3' and 4' shown in FIG. 3 may be substantially the same as the structure, components, and quantum dot material of the light conversion layers 3 and 4 shown in FIG. 2, and any repetitive detailed description thereof will be omitted.

Referring to FIG. 4, another alternative embodiment of the backlight unit may include a light guide 1' having a uniform thickness and having a shape of a transparent quadrangle plate, a light diffusion plate 2 disposed on the light guide 1', and a light emitting element 5' disposed on a plurality of sides, e.g., opposing sides, of the light guide 1'.

In an embodiment, the light emitting element 5' includes a blue light emitting chip to emit blue light, and a light conversion layer covering the blue light emitting chip and including a quantum dot to convert blue light into green light and red light. Accordingly, the light emitting element 5' emits white light.

In such an embodiment, where the light emitting element 5' to emit white light may be disposed at only one side of the light guide 1 as shown in FIGS. 2 and 3. In such an embodiment, where the light emitting element 5' to emit white light is used, the light conversion layers 3, 4, 3', and 4' may be omitted.

The light emitting element 5' that emits white light will be described later in greater detail.

FIGS. 5 to 7 are cross-sectional views of embodiments of a light emitting element according to the invention.

Referring to FIG. 5, an embodiment of a light emitting element, e.g., a white light emitting element, includes a light emitting diode chip 51 that emits blue light, and a light conversion layer 52 covering the light emitting diode chip 51. The light conversion layer 52 may be formed by mixing a quantum dot material 54 to convert blue light into green light and a quantum dot material 56 to convert blue light into red light with a resin and by applying the mixture, and may include a scatterer such as a silica and the like, or an auxiliary component to improve optical properties. The quantum dot material may include a nanocrystal and the like including at least one selected from a Si-based nanocrystal, a Group II-IV-based compound semiconductor nanocrystal, a Group III-V-based compound semiconductor nanocrystal, a Group IV-IV-based compound semiconductor nanocrystal, and a mixture thereof. The Group II-IV-based compound semiconductor nanocrystal may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, the Group III-V-based compound semiconductor nanocrystal may include GaN, GaP, GaAs, AlN, AlP, AlAs, InN, InP, InZnP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs and InAlPAs, and the Group IV-IV-based compound semiconductor nanocrystal may include SbTe. The quantum dot material may be included in an amount of less than or equal to about 5 wt % based on the total weight of the light conversion layer 52. The resin may include silicone, epoxy, acrylate or the like. The scatterer may include ZnO, $Al_2O_3$, ZrO or the like, and may be included in an amount of about 10 wt % based on the total weight of the light conversion layer 52.

Referring to FIG. 6, an alternative embodiment of a light emitting element, e.g., a white light emitting element, includes a light emitting diode chip 51 that emits blue light and a light conversion layer 52 covering the light emitting diode chip 51. The light conversion layer 52 may be formed by mixing a quantum dot material 54 to convert blue light into green light and a quantum dot material 56 to convert blue light into red light with a resin and by applying the mixture, and may include a scatterer such as a silica and the like, or an auxiliary component to improve optical properties. The quantum dot material and the scatterer in such an embodiment may be substantially the same as in the embodiment shown in FIG. 5. In such an embodiment shown in FIG. 6, the quantum dot material 54 to convert blue light into green light is first applied, and then the quantum dot material 56 to convert blue light into red light is applied thereafter, and thereby different layers from each other are formed. In such an embodiment, the quantum dot material 56 to convert blue light into red light may be first applied, and then the quantum dot material 54 to convert blue light into green light may be applied thereafter.

Referring to FIG. 7, in another alternative embodiment of a white light emitting element, a quantum dot film 53 to convert blue light into green light and a quantum dot film 57 to convert blue light into red light may be disposed on an emitting diode chip 51 to form a light conversion layer. The positions of the quantum dot film 53 to convert blue light into green light and the quantum dot film 57 to convert blue light into red light may be exchanged with each other, and may be formed in a single film including a quantum dot material to convert blue light into red light and a quantum dot material to convert blue light into green light. The structure, components, and quantum dot material of the quantum dot films 53 and 57 in such an embodiment may be the same as the structure, components, and quantum dot material of the light conversion layers 3 and 4 shown in FIG. 2.

In an embodiment, the backlight unit may be a direct-type. FIGS. 8 and 9 are cross-sectional views of embodiments of a direct-type backlight unit according to the invention.

Referring to FIG. 8, in an embodiment of a direct-type backlight unit, a plurality of blue light emitting elements 5 are aligned with a predetermined interval on a substrate 9, such as a printed circuit board ("PCB") and the like, and light conversion layers 3' and 4' to convert blue light into white light are disposed on the light emitting element 5. In such an embodiment, a diffusion plate 2 may be disposed on the light conversion layer 3' and 4'. In such an embodiment, two light conversion layers 3' and 4' may be separated from each other so that one of the two light conversion layers 3' and 4' may convert blue light into green light and the other of the two light conversion layers 3' and 4' may convert blue light into red light, or each of the two light conversion layers 3' and 4' may include a quantum dot to convert blue light into green light and a quantum dot to convert blue light into red light. In an alternative embodiment, the two light conversion layers 3' and 4' are attached to each other to be integrally formed as a single unitary and indivisible unit, and may define a single light conversion layer including a quantum dot to convert blue light into green light and a quantum dot to convert blue light into red light. The light conversion layers 3' and 4' may be formed by mixing a quantum dot material with a resin, and may include a scatterer, such as a silica and the like, or an auxiliary component to improve optical properties. The quantum dot material or the scatterer is the same as that in the embodiments described above, and any repetitive detailed description thereof will be omitted.

Referring to FIG. 9, in an alternative embodiment of a direct-type backlight unit, a plurality of white light emitting elements 5' are aligned with a predetermined interval on a substrate 9, such as a PCB and the like, and a diffusion plate 2 is disposed on the light emitting element 5'. In such an embodiment, the white light emitting element 5' are substantially the same as that of the embodiments described above referring to FIGS. 5 to 7.

In an embodiment, the white light of the aforementioned backlight unit includes red, green and blue components having color purity, with which an LCD may display color regions of near, greater than, or equal to about 80% of the DCI standard. Such color regions displayed by the LCD will be described in greater detail with a reference to color coordinates.

FIG. 10 is a graph showing a phenomenon of how a color region supported by a light source that emits white light including the green light component having a FWHM of 39 nm as the peak position of a green light component is shifted in color coordinates, and FIG. 11 is a graph showing a color region supported by a white light source, which is shifted in color coordinates by changing the peak position of a green light component having a FWHM of 48 nm according to several experiments. Herein, "a color region supported by a light source" may mean the color region displayed by an LCD including the light source. In FIGS. 10 and 11, a two-dashed-lined triangle indicates a DCI standard color region.

Table 1 shows an area in which each color region shown in FIGS. 10 and 11 is overlapped with the DCI standard color region as an area ratio of each color region relative to the DCI standard color region (hereinafter, will be referred to as "a DCI color region ratio"). Table 1 shows data obtained by changing a green quantum dot material in a light emitting element using a light emitting diode that emits blue light having a peak position of 449 nm and a FWHM of 18 nm and using a red quantum dot material that receives the blue light from the light emitting diode and changes the blue light into a red light component having a peak position of 631 nm and a FWHM of 48 nm.

TABLE 1

| Red 631 48     | Green FWHM (nm) |     |
| -------------- | --------------- | --- |
| Green peak (nm) | 48             | 39  |
| 530            | 87%             | 88% |
| 532            | 88%             | 90% |
| 534            | 89%             | 90% |
| 536            | 90%             | 91% |
| 538            | 91%             | 92% |
| 540            | 89%             | 91% |

Referring to Table 1, the DCI color region ratio is changed depending on the peak position and the FWHM of the green light component. Referring to FIGS. 10 and 11, a color region displayed as the peak position of the green light component shifts toward a high wavelength in a particular direction.

Now, characteristics of white light emitted by an embodiment of a backlight unit according to the invention will be described in greater detail based on experimental data.

FIG. 12 is a graph showing how a red apex in a color region supported by a light source that emits white light including a green light component shifts in color coordinates as the peak position of the green light component having a FWHM of 39 nm is shifted, FIG. 13 is a graph showing how a green apex in a color region supported by a light source that emits white light including the green light component shifts in color coordinates as the peak position of the green light component having a FWHM of 39 nm is shifted, and FIG. 14 is a graph showing how a blue apex in a color region supported by a light source that emits white light including the green light component shifts in color coordinates as the peak position of the green light component having a FWHM of 39 nm is shifted. In FIGS. 12 to 14, a two-dashed-line indicates a DCI standard color region.

Referring to FIG. 12, the red apex of a color region shifts in a left-up direction as the peak position of the green light component shifts toward a high wavelength. That is, the value of x of the red apex decreases while the value of y thereof increases.

Referring to FIG. 13, the green apex of the color region shifts in a right direction as the peak position of the green light component shifts toward a high wavelength. That is, the value of x of the green apex increases while the value of y thereof increases, and then decreases.

Referring to FIG. 14, the blue apex of the color region shifts in a down-right direction as the peak position of the green light component shifts toward a high wavelength. That is, the value of x of the blue apex increases while the value of y thereof decreases.

Table 2 is data showing 19 DCI color region ratios obtained by including each color region shown in FIGS. 12 to 14 and shifting the peak position of the green light component. Table 2 is data obtained by changing a green quantum dot material in a light emitting device including a light emitting diode that emits blue light having a peak position of about 449 nm and a FWHM of about 18 nm, and a red quantum dot material that receives the blue light and changes the blue light into a red light component having a peak position of about 631 nm and a FWHM of about 48 nm to about 49 nm. The green light component of the light emitting device has a full FWHM in a range from about 39 nm to about 40 nm. The color regions shown in FIGS. 12 to 14 are marked as #1, #2, #4, #6, #8, #10, #12, #14, #16, #18, and #19 in the following Table 2.

TABLE 2

|     | Blue peak | Blue FWHM | Green peak | Green FWHM | Red peak | Red FWHM | DCI (%) |
| --- | --- | --- | --- | --- | --- | --- | --- |
| #1  | 449 | 18 | 516 | 40 | 631 | 48 | 77.9 |
| #2  | 449 | 18 | 518 | 40 | 631 | 48 | 80   |
| #3  | 449 | 18 | 520 | 39 | 631 | 48 | 81.5 |
| #4  | 449 | 18 | 522 | 39 | 631 | 49 | 83.1 |
| #5  | 449 | 18 | 524 | 39 | 631 | 49 | 84.6 |
| #6  | 449 | 18 | 526 | 39 | 631 | 49 | 86   |
| #7  | 449 | 18 | 528 | 39 | 631 | 49 | 87.3 |
| #8  | 449 | 18 | 530 | 39 | 631 | 49 | 88.4 |
| #9  | 449 | 18 | 532 | 39 | 631 | 49 | 89.5 |
| #10 | 449 | 18 | 534 | 39 | 631 | 49 | 90.4 |
| #11 | 449 | 18 | 536 | 39 | 631 | 49 | 91.1 |
| #12 | 449 | 18 | 538 | 39 | 631 | 49 | 91.7 |
| #13 | 449 | 18 | 540 | 39 | 631 | 49 | 91   |
| #14 | 449 | 18 | 542 | 39 | 631 | 49 | 89.3 |
| #15 | 449 | 18 | 544 | 39 | 631 | 49 | 87.5 |
| #16 | 449 | 18 | 546 | 39 | 631 | 49 | 85.6 |
| #17 | 449 | 18 | 548 | 39 | 631 | 49 | 83.7 |
| #18 | 449 | 18 | 550 | 39 | 631 | 49 | 81.6 |
| #19 | 449 | 18 | 552 | 39 | 631 | 49 | 78.9 |

Referring to Table 2, when the green light component having a FWHM in a range from about 39 nm to about 40 nm has a peak position in a range of about 518 nm to about 550 nm, the DCI color region ratio of the light from the light emitting device becomes greater than or equal to about 80%, and when the green light component has a peak position in a range of about 534 nm to about 540 nm, the DCI color region ratio of the light from the light emitting device becomes greater than or equal to about 90%.

Table 3 provides the coordinates of red, green and blue apexes in the 19 color region data of Table 2.

TABLE 3

|  | #1 | | #2 | | #3 | | #4 | | #5 | | #6 | | #7 | |
|---|---|---|---|---|---|---|---|---|---|---|---|---|---|---|
|  | x | y | x | y | x | y | x | y | x | y | x | y | x | y |
| Red | 0.6820 | 0.3093 | 0.6821 | 0.3092 | 0.6816 | 0.3093 | 0.6813 | 0.3092 | 0.6810 | 0.3093 | 0.6807 | 0.3093 | 0.6804 | 0.3093 |
| Green | 0.1682 | 0.6418 | 0.1768 | 0.6440 | 0.1811 | 0.6531 | 0.1881 | 0.6568 | 0.1953 | 0.6594 | 0.2028 | 0.6610 | 0.2106 | 0.6615 |
| Blue | 0.1414 | 0.0951 | 0.1431 | 0.0885 | 0.1439 | 0.0881 | 0.1450 | 0.0846 | 0.1460 | 0.0813 | 0.1469 | 0.0780 | 0.1477 | 0.0749 |

|  | #8 | | #9 | | #10 | | #11 | | #12 | | #13 | | #14 | |
|---|---|---|---|---|---|---|---|---|---|---|---|---|---|---|
|  | x | y | x | y | x | y | x | y | x | y | x | y | x | y |
| Red | 0.6799 | 0.3094 | 0.6794 | 0.3096 | 0.6789 | 0.3097 | 0.6782 | 0.3100 | 0.6774 | 0.3103 | 0.6764 | 0.3107 | 0.6751 | 0.3113 |
| Green | 0.2186 | 0.6611 | 0.2268 | 0.6598 | 0.2352 | 0.6578 | 0.2437 | 0.6551 | 0.2523 | 0.6518 | 0.2611 | 0.6478 | 0.2699 | 0.6435 |
| Blue | 0.1485 | 0.0717 | 0.1491 | 0.0687 | 0.1498 | 0.0657 | 0.1503 | 0.0629 | 0.1508 | 0.0602 | 0.1512 | 0.0575 | 0.1516 | 0.0550 |

|  | #15 | | #16 | | #17 | | #18 | | #19 | |
|---|---|---|---|---|---|---|---|---|---|---|
|  | x | y | x | y | x | y | x | y | x | y |
| Red | 0.6737 | 0.3120 | 0.6719 | 0.3130 | 0.6696 | 0.3143 | 0.6667 | 0.3160 | 0.6645 | 0.3172 |
| Green | 0.2789 | 0.6386 | 0.2879 | 0.6334 | 0.2970 | 0.6278 | 0.3061 | 0.6221 | 0.3148 | 0.6125 |
| Blue | 0.1519 | 0.0526 | 0.1521 | 0.0503 | 0.1523 | 0.0482 | 0.1525 | 0.0463 | 0.1526 | 0.0432 |

FIG. 15 is a graph showing how the red apex of a color region supported by a light source that emits white light including a green light component having a FWHM of 48 nm shifts in color coordinates, as the peak position of a green light component is shifted, FIG. 16 is a graph showing how the green apex of a color region supported by a light source emitting white light including a green light component having a FWHM of 48 nm shifts in color coordinates, as the peak position of a green light component is shifted, and FIG. 17 is a graph showing how the blue apex of a color region supported by a light source emitting white light including a green light component having a FWHM of 48 nm shifts in color coordinates, as the peak position of a green light component is shifted. In FIGS. 15 to 17, a two-dashed-line indicates a DCI standard color region.

Referring to FIG. 15, the red apex of the color region shifts in a left-up direction as the peak position of the green light component shifts toward a high wavelength. That is, the value of x of the red apex decreases while the value of y thereof increases.

Referring to FIG. 16, the green apex of the color shifts in a right direction as the peak position of the green light component shifts toward a high wavelength. That is, the value of x of the green apex increases while the value of y thereof increases and then, decreases.

Referring to FIG. 17, the blue apex of the color region shifts in a right-down direction as the peak position of the green light component shifts toward a high wavelength. That is, the value of x of the blue apex increases while the value of y thereof decreases.

Table 4 shows 19 DCI color region ratio data obtained by including each color region in FIGS. 15 to 17 and moving 15 to 17 are marked as #1, #2, #4, #6, #8, #10, #12, #14, #16, #18, and #19 in the following Table 2.

TABLE 4

|  | Blue peak | Blue FWHM | Green peak | Green FWHM | Red peak | Red FWHM | DCI |
|---|---|---|---|---|---|---|---|
| #1 | 449 | 18 | 516 | 49 | 631 | 49 | 79.3 |
| #2 | 449 | 18 | 518 | 49 | 631 | 49 | 80.9 |
| #3 | 449 | 18 | 520 | 48 | 631 | 49 | 82.3 |
| #4 | 449 | 18 | 522 | 48 | 631 | 49 | 83.7 |
| #5 | 449 | 18 | 524 | 48 | 631 | 49 | 84.4 |
| #6 | 449 | 18 | 526 | 48 | 631 | 49 | 85 |
| #7 | 449 | 18 | 528 | 48 | 631 | 49 | 86.2 |
| #8 | 449 | 18 | 530 | 48 | 631 | 49 | 87.3 |
| #9 | 449 | 18 | 532 | 48 | 631 | 49 | 88.4 |
| #10 | 449 | 18 | 534 | 48 | 631 | 49 | 89.3 |
| #11 | 449 | 18 | 536 | 48 | 631 | 49 | 90.2 |
| #12 | 449 | 18 | 538 | 48 | 631 | 49 | 90.6 |
| #13 | 449 | 18 | 540 | 48 | 631 | 49 | 89.4 |
| #14 | 449 | 18 | 542 | 48 | 631 | 49 | 88 |
| #15 | 449 | 18 | 544 | 48 | 631 | 49 | 86.5 |
| #16 | 449 | 18 | 546 | 48 | 631 | 49 | 84.8 |
| #17 | 449 | 18 | 548 | 48 | 631 | 49 | 82.9 |
| #18 | 449 | 18 | 550 | 48 | 631 | 49 | 80.8 |
| #19 | 449 | 18 | 552 | 48 | 631 | 49 | 78.5 |

Referring to Table 4, when the green light component having a FWHM of 48 nm to 49 nm has a peak position in a range of 518 nm to 550 nm, the DCI color region ratio of the light from the light emitting element becomes greater than or equal to about 80%, and when the peak position is in a range of 536 nm to 538 nm, the DCI color region ratio of the light from the light emitting element becomes greater than or equal to 90%.

Table 5 provides the coordinates of red, green and blue apexes of the 19 color region data of Table 4.

TABLE 5

|  | #1 | | #2 | | #3 | | #4 | | #5 | | #6 | | #7 | |
|---|---|---|---|---|---|---|---|---|---|---|---|---|---|---|
|  | x | y | x | y | x | y | x | y | x | y | x | y | x | y |
| Red | 0.6804 | 0.3104 | 0.6801 | 0.3105 | 0.6798 | 0.3105 | 0.6794 | 0.3106 | 0.6792 | 0.3107 | 0.6790 | 0.3107 | 0.6785 | 0.3109 |
| Green | 0.1903 | 0.6330 | 0.1961 | 0.6375 | 0.2021 | 0.6411 | 0.2084 | 0.6439 | 0.2116 | 0.6450 | 0.2149 | 0.6459 | 0.2217 | 0.6470 |
| Blue | 0.1423 | 0.0898 | 0.1433 | 0.0867 | 0.1443 | 0.0838 | 0.1452 | 0.0809 | 0.1456 | 0.0795 | 0.1461 | 0.0781 | 0.1469 | 0.0753 |

|  | #8 | | #9 | | #10 | | #11 | | #12 | | #13 | | #14 | |
|---|---|---|---|---|---|---|---|---|---|---|---|---|---|---|
|  | x | y | x | y | x | y | x | y | x | y | x | y | x | y |
| Red | 0.6780 | 0.3111 | 0.6773 | 0.3114 | 0.6766 | 0.3117 | 0.6758 | 0.3122 | 0.6747 | 0.3127 | 0.6735 | 0.3134 | 0.6721 | 0.3142 |
| Green | 0.2286 | 0.6473 | 0.2358 | 0.6470 | 0.2431 | 0.6459 | 0.2506 | 0.6443 | 0.2582 | 0.6420 | 0.2659 | 0.6392 | 0.2738 | 0.6359 |
| Blue | 0.1476 | 0.0725 | 0.1483 | 0.0699 | 0.1489 | 0.0673 | 0.1494 | 0.0648 | 0.1499 | 0.0623 | 0.1504 | 0.0599 | 0.1508 | 0.0576 |

|  | #15 | | #16 | | #17 | | #18 | | #19 | |
|---|---|---|---|---|---|---|---|---|---|---|
|  | x | y | x | y | x | y | x | y | x | y |
| Red | 0.6703 | 0.3153 | 0.6682 | 0.3167 | 0.6656 | 0.3185 | 0.6623 | 0.3207 | 0.6584 | 0.3235 |
| Green | 0.2817 | 0.6323 | 0.2897 | 0.6282 | 0.2978 | 0.6237 | 0.3058 | 0.6190 | 0.3140 | 0.6139 |
| Blue | 0.1511 | 0.0554 | 0.1515 | 0.0533 | 0.1517 | 0.0513 | 0.1520 | 0.0494 | 0.1522 | 0.0476 | the peak position of the green light component. Table 4 shows data obtained by changing a green quantum dot material in a light emitting element including a light emitting diode that emits blue light having a peak position of about 449 nm and a FWHM of 18 nm, and a red quantum dot material that receives the blue light and changes the blue light into a red light component having a peak position of about 631 nm and a FWHM of about 49 nm. The green light component of the light emitting device has a FWHM in a range of 48 nm to 49 nm. The color regions shown in FIGS.

FIG. 18 shows how the red apex of a color region supported by a light source that emits white light including a green light component having a FWHM of 54 nm is shifted in color coordinates, as the peak position of the green light component is shifted, FIG. 19 shows how the green apex of a color region supported by a light source that emits white light including a green light component having a FWHM of 54 nm is shifted in color coordinates, as the peak position of the green light component is shifted, and FIG. 20 shows how the blue apex of a color region supported by a light source that emits white light including a green light component having a FWHM of 54 nm is shifted in color coordinates, as the peak position of the green light component is shifted.

Referring to FIG. 18, the red apex of the color region shifts in a left-up direction as the peak position of the green light component shifts toward a high wavelength. That is, the value of x of the red apex decreases while the value of y thereof increases.

Referring to FIG. 19, the green apex of the color region shifts in a rightward direction as the peak position of the green light component shifts toward a high wavelength. That is, the value of x of the green apex increases while the value of y thereof increases, and then decreases.

Referring to FIG. 20, the blue apex of the color region shifts in a right-down direction as the peak position of the green light component shifts toward a high wavelength. That is, the value of x of the blue apex increases while the value of y thereof decreases.

Table 6 shows 19 DCI color region ratio data obtained by including each color region shown in FIGS. 18 to 20 and shifting the peak position of the green light component. Table 6 shows data obtained by changing a green quantum dot material in a light emitting element including a light emitting diode that emits blue light having a peak position of 449 nm and a FWHM of 18 nm, and a red quantum dot material that receives the blue light and shifts the blue light into a red light component having a peak position of 631 nm and a FWHM of 49 nm. The green light component has a FWHM in a range from 52 nm to 54 nm. The color regions shown in FIGS. 18 to 20 are marked as #1, #2, #4, #6, #8, #10, #12, #14, #16, #18, and #19 in the following Table 6.

TABLE 6

| | Blue peak | Blue FWHM | Green peak | Green FWHM | Red peak | Red FWHM | DCI |
|---|---|---|---|---|---|---|---|
| #1 | 449 | 18 | 516 | 54 | 631 | 49 | 78.7 |
| #2 | 449 | 18 | 518 | 54 | 631 | 49 | 80.3 |
| #3 | 449 | 18 | 520 | 54 | 631 | 49 | 81.7 |
| #4 | 449 | 18 | 522 | 54 | 631 | 49 | 83.1 |
| #5 | 449 | 18 | 524 | 54 | 631 | 49 | 84.4 |
| #6 | 449 | 18 | 526 | 54 | 631 | 49 | 85.6 |
| #7 | 449 | 18 | 528 | 54 | 631 | 49 | 86.7 |
| #8 | 449 | 18 | 530 | 54 | 631 | 49 | 87.7 |
| #9 | 449 | 18 | 532 | 54 | 631 | 49 | 88.7 |
| #10 | 449 | 18 | 534 | 54 | 631 | 49 | 89.5 |
| #11 | 449 | 18 | 536 | 54 | 631 | 49 | 89.9 |
| #12 | 449 | 18 | 538 | 54 | 631 | 49 | 89.1 |
| #13 | 449 | 18 | 540 | 54 | 631 | 49 | 87.9 |
| #14 | 449 | 18 | 542 | 53 | 631 | 49 | 86.4 |
| #15 | 449 | 18 | 544 | 53 | 631 | 49 | 84.7 |
| #16 | 449 | 18 | 546 | 53 | 631 | 49 | 82.9 |
| #17 | 449 | 18 | 548 | 53 | 631 | 49 | 80.9 |
| #18 | 449 | 18 | 550 | 52 | 631 | 49 | 78.7 |
| #19 | 449 | 18 | 552 | 52 | 631 | 49 | 76.2 |

Referring to Table 6, when the green light component having a FWHM in a range from 52 nm to 54 nm has a peak position in a range from 518 nm to 548 nm, the DCI color region ratio of the light from the light emitting element becomes greater than or equal to 80%.

Table 7 shows the coordinates of the red, green and blue apexes in the 19 color region data of Table 6.

TABLE 7

| | #1 | | #2 | | #3 | | #4 | | #5 | | #6 | | #7 | |
|---|---|---|---|---|---|---|---|---|---|---|---|---|---|---|
| | x | y | x | y | x | y | x | y | x | y | x | y | x | y |
| Red | 0.6804 | 0.3103 | 0.6800 | 0.3104 | 0.6796 | 0.3105 | 0.6792 | 0.3107 | 0.6787 | 0.3109 | 0.6781 | 0.3111 | 0.6775 | 0.3114 |
| Green | 0.1928 | 0.6276 | 0.1984 | 0.6321 | 0.2043 | 0.6359 | 0.2104 | 0.6390 | 0.2167 | 0.6412 | 0.2231 | 0.6426 | 0.2299 | 0.6433 |
| Blue | 0.1418 | 0.0902 | 0.1429 | 0.0872 | 0.1439 | 0.0844 | 0.1448 | 0.0817 | 0.1456 | 0.0789 | 0.1464 | 0.0762 | 0.1471 | 0.0736 |

| | #8 | | #9 | | #10 | | #11 | | #12 | | #13 | | #14 | |
|---|---|---|---|---|---|---|---|---|---|---|---|---|---|---|
| | x | y | x | y | x | y | x | y | x | y | x | y | x | y |
| Red | 0.6768 | 0.3118 | 0.6760 | 0.3122 | 0.6750 | 0.3128 | 0.6740 | 0.3133 | 0.6725 | 0.3142 | 0.6710 | 0.3152 | 0.6691 | 0.3164 |
| Green | 0.2367 | 0.6432 | 0.2437 | 0.6426 | 0.2508 | 0.6414 | 0.2581 | 0.6385 | 0.2654 | 0.6371 | 0.2728 | 0.6343 | 0.2804 | 0.6310 |
| Blue | 0.1478 | 0.0710 | 0.1484 | 0.0685 | 0.1490 | 0.0661 | 0.1496 | 0.0630 | 0.1500 | 0.0613 | 0.1505 | 0.0591 | 0.1509 | 0.0569 |

| | #15 | | #16 | | #17 | | #18 | | #19 | |
|---|---|---|---|---|---|---|---|---|---|---|
| | x | y | x | y | x | y | x | y | x | y |
| Red | 0.6669 | 0.3179 | 0.6643 | 0.3197 | 0.6611 | 0.3220 | 0.6573 | 0.3248 | 0.6525 | 0.3284 |
| Green | 0.2880 | 0.6274 | 0.2957 | 0.6234 | 0.3034 | 0.6190 | 0.3111 | 0.6144 | 0.3189 | 0.6095 |
| Blue | 0.1512 | 0.0548 | 0.1515 | 0.0528 | 0.1518 | 0.0509 | 0.1520 | 0.0491 | 0.1523 | 0.0474 |

Referring to Tables 3, 5 and 7, when a triangle color region is displayed to have a red apex in the region of $0.6611 < Cx < 0.6821$ and $0.3092 < Cy < 0.3220$, a green apex in the region of $0.1768 < Cx < 0.3061$ and $0.6190 < Cy < 0.6615$, and a blue apex in the region of $0.1429 < Cx < 0.1525$ and $0.0463 < Cy < 0.0885$ in color coordinates, the color region may display about 80% of a DCI standard. Accordingly, an embodiment of a backlight unit according the invention may be constituted to emit white light including red, green and blue components having color purity capable of displaying such a triangle color region.

In an embodiment, when a triangle color region is displayed to have a red apex in the region of $0.6747 < Cx < 0.6789$ and $0.3097 < Cy < 0.3127$, a green apex in the region of $0.2352 < Cx < 0.2611$ and $0.6420 < Cy < 0.6578$, and a blue apex in the region of $0.1494 < Cx < 0.1512$ and $0.0575 < Cy < 0.0657$ in color coordinates, the color region may display about 90% of a DCI standard. Accordingly, an embodiment of a backlight unit according to the invention may be constituted to emit white light including red, green and blue components having color purity capable of displaying such a triangle color region.

In an embodiment, based on data above, when a triangle color region is displayed to have a red apex in the region of $0.65 < Cx < 0.69$ and $0.29 < Cy < 0.33$, a green apex in the region of 0.20<Cx<0.3 and 0.63<Cy<0.70, and a blue apex in the region of 0.12<Cx<0.18 and 0.05<Cy<0.09 in color coordinates, the color region may display greater than or equal to about 75% of a DCI standard. Accordingly, an embodiment of a backlight unit according the invention may be constituted to emit white light including red, green, and blue components having color purity capable of displaying such a triangle color region.

Table 8 shows a DCI color region ratio supported by a white light source including a green light component having a peak position of 538 nm by changing the FWHM of the green light component according to various experimental embodiments. Table 8 shows data obtained by changing a green quantum dot material in a light emitting element using a light emitting diode that emits blue light having a peak position of 449 nm and a FWHM of 18 nm, and a red quantum dot material that receives the blue light and changes the blue light into a red light component having a peak position of 635 nm and a FWHM of 42 nm.

TABLE 8

|  | Blue peak | Blue FWHM | Green peak | Green FWHM | Red peak | Red FWHM | DCI (%) |
|---|---|---|---|---|---|---|---|
| #1 | 449 | 18 | 538 | 39 | 635 | 42 | 91.5 |
| #2 | 449 | 18 | 538 | 62 | 635 | 42 | 88.5 |
| #3 | 449 | 18 | 538 | 71 | 635 | 42 | 85.3 |
| #4 | 449 | 18 | 538 | 85 | 635 | 42 | 81.7 |
| #5 | 449 | 18 | 538 | 88 | 635 | 42 | 80.6 |
| #6 | 449 | 18 | 538 | 90 | 635 | 42 | 79.7 |

Referring to Table 8, when the green light component has a FWHM of less than 90 nm, the DCI color region ratio of light from the white light source becomes greater than or equal to 80%.

Table 9 shows a DCI color region ratio supported by each white light source by changing the peak position of a red light component having a FWHM of 49 nm according to various experimental embodiments. Table 9 shows data obtained by changing a red quantum dot material in a light emitting element using a light emitting diode that emits blue light having a peak position of 449 nm and a FWHM of 18 nm, and a red quantum dot material that receives the blue light and shifts the blue light into a green light component having a peak position of 550 nm and a FWHM of 38 nm.

TABLE 9

|  | Blue peak | Blue FWHM | Green peak | Green FWHM | Red peak | Red FWHM | DCI (%) |
|---|---|---|---|---|---|---|---|
| #1 | 449 | 18 | 550 | 38 | 622 | 49 | 80 |
| #2 | 449 | 18 | 550 | 38 | 624 | 49 | 80 |
| #3 | 449 | 18 | 550 | 38 | 625 | 49 | 80 |
| #4 | 449 | 18 | 550 | 38 | 626 | 49 | 81 |

Referring to Table 9, when the red light component has a peak position of greater than or equal to 620 nm, the DCI color region ratio of light of a white light source becomes near 80%.

FIG. 21 is a graph showing luminance change of white light emitted by a backlight unit (or a light source) depending on the peak position of the red light component.

Referring to FIG. 21, as the peak position of the red light component shifts toward a long wavelength, the luminance of white light emitted by the backlight unit (a light source) becomes lower. When the red light component has a peak position of greater than 645 nm, the luminance is deteriorated to less than or equal to 90%. Accordingly, an embodiment of the backlight unit (or a light source) according to the invention may include a red light component having a peak position in a range from 620 nm to 645 nm.

An embodiment of the backlight unit (or a light source) according to the invention emits white light including red light, green light and blue light having high color purity. Accordingly, a small spectrum change of white light may occur before and after passing through a color filter.

FIG. 22 is a graph comparing the spectrum of white light emitted from an embodiment of the backlight unit (or a light source) according to the invention and the spectrum of the white light after passing through the color filter. Table 10 shows peak positions and FWHM of the green and red light components in the graph of FIG. 22. The spectrum of white light is obtained by using a spectroscope, and the spectrum after the white light passed through a color filter is obtained by combining the spectrum of a green component of the white light passed through a green color filter, the spectrum of a red component of the white light passed through a red color filter, and the spectrum of a blue component of the white light passed through a blue color filter. Herein, the color filters are color filters used for a general television or monitor. When a spectrum is measured by combining a backlight unit with a liquid crystal panel to build a LCD, a color filter in the liquid crystal panel may be used such that a red spectrum is obtained by turning on red pixels of the LCD and turning off the rest of pixels thereof, a green spectrum is obtained by turning on green pixels of the LCD and turning off the rest of pixels thereof, and a blue spectrum is obtained by turning on blue pixels of the LCD and turning off the rest of pixels thereof.

TABLE 10

|  | Before passing C/F | After passing C/F |
|---|---|---|
| Green peak | 537 | 536 |
| Green FWHM | 41 | 40 |
| Red peak | 629 | 628 |
| Red FWHM | 52 | 50 |

Referring to FIG. 22 and Table 10, green and red light components of white light emitted from an embodiment of a backlight unit (or a light source) show a peak position change of 1 nm and thus almost no peak position change before and after passing through the color filter and each change of FWHM of 1 nm and 2 nm, that is, less than or equal to 2 nm. In such an embodiment, the backlight unit (or a light source) changes blue light to green and red lights by using a quantum dot material and thus produces white light.

A light conversion layer used in an embodiment of the backlight unit (or a light source) may include a scatterer as well as the quantum dot material. The scatterer may include at least one of ZnO, $Al_2O_3$, ZrO and the like, and may improve luminance. Table 11 shows luminance and white color coordinate changes depending on a kind of scatterer. The scatterer may be included in an amount of less than or equal to 10 wt % based on the entire weight of the light conversion layer.

TABLE 11

| Scatterer | Concentration (wt %) | Film measurement | | |
|---|---|---|---|---|
|  |  | Brightness (Lv.) | Cx | Cy |
| $Al_2O_3$ | 4 | 268.5 | 0.198 | 0.1649 |
| ZnO | 5 | 331.9 | 0.2074 | 0.1977 |
| $ZrO_2$ | 5 | 306.2 | 0.2011 | 0.1850 |

Referring to Table 11, when ZnO is used as the scatterer, the greatest luminance improvement may be obtained.

Table 12 shows luminance and white color coordinate changes when the ZnO is used as the scatterer.

TABLE 12

| Scatterer | Concentration (wt %) | Film measurement | | |
|---|---|---|---|---|
| | | Brightness (Lv.) | Cx | Cy |
| ZnO | 1 | 318.1 | 0.2260 | 0.2248 |
| | 3 | 339.8 | 0.2416 | 0.2667 |
| | 5 | 328.2 | 0.2396 | 0.2632 |

Referring to Table 12, luminance and a white color coordinates of white light emitted from the backlight unit may be adjusted by controlling the amount of the scatterer.

Table 13 shows color temperature change of white light depending on white color coordinates. The white color coordinates may be obtained by adjusting a ratio among the scatterer and red and green quantum dot materials, and for example, a ratio within the range provided in Table 13.

TABLE 13

| X | Y | CCT (K) |
|---|---|---|
| 0.303 | 0.319 | 7179 |
| 0.303 | 0.339 | 6931 |
| 0.313 | 0.329 | 6488 |
| 0.323 | 0.339 | 5933 |
| 0.323 | 0.319 | 5998 |
| 0.26 | 0.28 | 13,689 |
| 0.26 | 0.3 | 11,626 |
| 0.27 | 0.29 | 11,152 |
| 0.28 | 0.3 | 9468 |
| 0.28 | 0.28 | 10,618 |

Referring to Table 13, the color temperature of white light may be in a range of about 5900 Kelvin (K) to about 14,000 K.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A light source comprising
a light emitting element which emits light, and
a light conversion layer configured not to include an organic photoluminescent compound, wherein the light conversion layer converts the light emitted from the light emitting element into white light and emits the white light, and the light conversion layer comprises a resin, a quantum dot material mixed with the resin, and a scatterer mixed with the resin, wherein the scatterer of the light conversion layer is in an amount of less than or equal to about 10 wt % based on the total weight of the light conversion layer,
wherein the quantum dot material comprises a green quantum dot material which converts the light emitted from the light emitting element to a green light component, and a red quantum dot material which converts the light emitted from the light emitting element to a red light component,
wherein the white light comprises:
a green light component having a peak wavelength of about 518 nm to about 550 nm and a full width at half maximum (FWHM) of less than about 90 nm; and
a red light component having a peak wavelength greater than or equal to about 620 nm, and
wherein
a red apex of a color region of the white light is positioned in a region of 0.65<Cx<0.69 and 0.29<Cy<0.33 in color coordinates, and
a green apex of the color region of the white light is positioned in a region of 0.17<Cx<0.31 and 0.61<Cy<0.70 in the color coordinates.

2. The light source of claim 1, wherein the red light component has a peak wavelength of about 620 nm to about 640 nm.

3. The light source of claim 1, wherein the quantum dot material of the light conversion layer is in an amount of less than or equal to about 5 wt % based on the total weight of the light conversion layer.

4. The light source of claim 1, wherein the green light component has a peak wavelength of about 534 nm to about 540 nm, and a full width at half maximum (FWHM) of less than or equal to about 39 nm.

5. The light source of claim 1, wherein the scatterer comprises at least one of ZnO, $Al_2O_3$ and ZrO.

6. The light source of claim 1, wherein the color temperature of the white light is in a range from about 5900 K to about 14,000 K.

7. The light source of claim 1, wherein
the white light comprises a blue light component, and
the red light component, the green light component and the blue light component display a color region of equal to or greater than about 80% of a digital cinema initiative (DCI) standard.

8. The light source of claim 1, wherein the quantum dot material comprises at least one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InZnP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, SbTe and a combination thereof.

9. The light source of claim 1, wherein the quantum dot material comprises:
an InP or InZnP core; and
a coating comprising a mixture of ZnSe and ZnS.

10. The light source of claim 1, wherein
the red apex of a color region of the white light is positioned in a region of 0.6611<Cx<0.6821 and 0.3092<Cy<0.3220 in color coordinates, and
the green apex of the color region of the white light is positioned in a region of 0.1768<Cx<0.3061 and 0.6190<Cy<0.6615 in the color coordinates.

11. The light source of claim 10, wherein
the red apex is positioned in a region of 0.6747<Cx<0.6789 and 0.3097<Cy<0.3127 in the color coordinates, and
the green apex is positioned in a region of 0.2352<Cx<0.2611 and 0.6420<Cy<0.6578 in the color coordinates.

12. The light source of claim 1, wherein
the green light component of the white light has a difference of a full width at half maximum (FWHM)

between before and after the white light passes through a green color filter, of less than or equal to about 2 nm, and the red light component of the white light has a difference of a full width at half maximum (FWHM), between before and after the white light passes through a red color filter, of less than or equal to about 2 nm.

13. A light source comprising:

a light emitting element which emits light, and a light conversion layer configured not to include an organic photoluminescent compound, wherein the light conversion layer converts the light emitted from the one light emitting element into white light and emits the white light, and the light conversion layer comprises a resin, a quantum dot material mixed with the resin, and a scatterer mixed with the resin, wherein the scatterer of the light conversion layer is in an amount of less than or equal to about 10 wt % based on the total weight of the light conversion layer, wherein the quantum dot material comprises a green quantum dot material which converts the light emitted from the light emitting element to a green light component, and a red quantum dot material which converts the light emitted from the light emitting element to a red light component, wherein the white light comprises:

the green light component having a peak wavelength of about 518 nm to about 550 nm and a full width at half maximum (FWHM) of less than about 90 nm; and the red light component having a peak wavelength greater than or equal to about 620 nm, wherein a red apex of a color region of the white light is positioned in a region of 0.65<Cx<0.69 and 0.29<Cy<0.33 in color coordinates, and a green apex of the color region of the white light is positioned in a region of 0.17<Cx<0.31 and 0.61<Cy<0.70 in the color coordinates.

14. The light source of claim 13, wherein the light conversion layer further comprises a scatterer.

15. The light source of claim 13, wherein the quantum dot material comprises at least one of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InZnP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, SbTe, and a combination thereof, and the scatterer comprises at least one of ZnO, Al$_2$O$_3$ and ZrO.

16. The light source of claim 13, wherein the red apex is positioned in a region of 0.6611<Cx<0.6821 and 0.3092<Cy<0.3220 in the color coordinates, and the green apex is positioned in a region of 0.1768<Cx<0.3061 and 0.6190<Cy<0.6615 in the color coordinates.

17. The light source of claim 16, wherein the red apex is positioned in a region of 0.6747<Cx<0.6789 and 0.3097<Cy<0.3127 in the color coordinates, and the green apex is positioned in a region of 0.2352<Cx<0.2611 and 0.6420<Cy<0.6578 in the color coordinates.

18. A backlight unit comprising:

a light emitting element which emits light, and a light conversion layer configured not to include an organic photoluminescent compound, wherein the light conversion layer converts the light emitted from the light emitting element into white light and emits the white light, and the light conversion layer comprises a resin, a quantum dot material mixed with the resin, and a scatterer mixed with the resin, wherein the scatterer of the light conversion layer is in an amount of less than or equal to about 10 wt % based on the total weight of the light conversion layer, wherein the quantum dot material comprises a green quantum dot material which converts the light emitted from the light emitting element to a green light component, and a red quantum dot material which converts the light emitted from the light emitting element to a red light component, wherein the white light comprises:

the green light component having a peak wavelength of about 518 nm to about 550 nm and a full width at half maximum (FWHM) of less than about 90 nm; and the red light component having a peak wavelength greater than or equal to about 620 nm, and wherein a red apex of a color region of the white light is positioned in a region of 0.65<Cx<0.69 and 0.29<Cy<0.33 in color coordinates, and a green apex of the color region of the white light is positioned in a region of 0.17<Cx<0.31 and 0.61<Cy<0.70 in the color coordinates.

19. The backlight unit of claim 18, wherein the light emitting element comprises a blue light emitting diode, and the light conversion layer comprises a film separately defined from the blue light emitting diode.

20. The backlight unit of claim 19, which further comprises:

a light guide, wherein the light conversion layer is disposed between the light emitting element and the light guide.

21. The backlight unit of claim 19, which further comprises:

a light guide, wherein the light guide is disposed between the light emitting element and the light conversion layer such that light emitted from the light emitting element is transferred to the light conversion layer.

22. The backlight unit of claim 18, wherein the light emitting element comprises a blue light emitting diode chip, and the light conversion layer, wherein the light conversion layer is disposed to cover the blue light emitting diode chip.

23. The backlight unit of claim 18, wherein the red apex is positioned in a region of 0.6611<Cx<0.6821 and 0.3092<Cy<0.3220 in the color coordinates, and the green apex is positioned in a region of 0.1768<Cx<0.3061 and 0.6190<Cy<0.6615 in the color coordinates.

24. The backlight unit of claim 23, wherein the red apex is positioned in a region of 0.6747<Cx<0.6789 and 0.3097<Cy<0.3127 in the color, and the green apex is positioned in a region of 0.2352<Cx<0.2611 and 0.6420<Cy<0.6578 in the color coordinates.

25. The backlight unit of claim 18, wherein the color temperature of the white light is in a range from about 5900 K to about 14,000 K.

26. A liquid crystal display, comprising
a liquid crystal panel comprising a plurality of color filters, and
a backlight unit comprising:
a light emitting element which emits light; and
a light conversion layer configured not to include an organic photoluminescent compound, wherein the light conversion layer converts the light emitted from the light emitting element into white light, and supplies the white light to the liquid crystal panel,
wherein the light conversion layer comprises a resin, a quantum dot material mixed with the resin, and a scatterer mixed with the resin,
wherein the scatterer of the light conversion layer is in an amount of less than or equal to about 10 wt % based on the total weight of the light conversion layer,
wherein the quantum dot material comprises a green quantum dot material which converts the light emitted from the light emitting element to a green light component, and a red quantum dot material which converts the light emitted from the light emitting element to a red light component,
wherein the white light comprises:
the green light component having a peak wavelength of about 518 nm to about 550 nm and a full width at half maximum (FWHM) of less than about 90 nm; and
the red light component having a peak wavelength greater than or equal to about 620 nm, and
wherein
a red apex of a color region of the white light is positioned in a region of 0.65<Cx<0.69 and 0.29<Cy<0.33 in color coordinates after the white light passes through the color filters, and
a green apex of the color region of the white light is positioned in a region of 0.17<Cx<0.31 and 0.61<Cy<0.70 in the color coordinates after the white light passes through the color filters.

27. The liquid crystal display of claim 26, wherein the light conversion layer comprises a scatterer.

28. The liquid crystal display of claim 26, wherein
the plurality of color filters comprise a green color filter, a red color filter, and a blue color filter,
the green light component of the white light has a difference of a full width at half maximum (FWHM), between before and after the white light passes through the green color filter, of less than or equal to about 2 nm, and
the red light component of the white light has a difference of a full width at half maximum (FWHM), between before and after the white light passes through the red color filter, of less than or equal to about 2 nm.

29. The liquid crystal display of claim 26, wherein
the red apex is positioned in a region of 0.6611<Cx<0.6821 and 0.3092<Cy<0.3220 in the color coordinates after the white light passes through the color filters, and
the green apex is positioned in a region of 0.1768<Cx<0.3061 and 0.6190<Cy<0.6615 in the color coordinates after the white light passes through the color filters.

30. The liquid crystal display of claim 29, wherein the red apex is positioned in a region of 0.6747<Cx<0.6789 and 0.3097<Cy<0.3127 in the color coordinates after the white light passes through the color filters, and
the green apex is positioned in a region of 0.2352<Cx<0.2611 and 0.6420<Cy<0.6578 in the color coordinates after the white light passes through the color filters.

* * * * *